(12) United States Patent
Park et al.

(10) Patent No.: US 12,367,920 B2
(45) Date of Patent: Jul. 22, 2025

(54) SRAM CELL CONFIGURED TO PERFORM MULTIPLY-ACCUMULATE (MAC) OPERATION ON MULTI-BIT DATA BASED ON CHARGE SHARING AND METHOD OF OPERATING THE SAME

(71) Applicant: SAMSUNG ELECTRONICS CO., LTD., Suwon-si (KR)

(72) Inventors: Jongsun Park, Seoul (KR); Kyeongho Lee, Seoul (KR); Hyunjun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 18/180,623

(22) Filed: Mar. 8, 2023

(65) Prior Publication Data

US 2023/0395132 A1    Dec. 7, 2023

(30) Foreign Application Priority Data

Jun. 3, 2022 (KR) .................. 10-2022-0068464

(51) Int. Cl.
G11C 11/4093 (2006.01)
G06F 7/501 (2006.01)
(Continued)

(52) U.S. Cl.
CPC .......... G11C 11/4093 (2013.01); G06F 7/501 (2013.01); G11C 11/4085 (2013.01); G11C 11/4094 (2013.01)

(58) Field of Classification Search
CPC ............ G11C 11/4093; G11C 11/4085; G11C 11/4094; G11C 7/1006; G11C 7/18; G11C 8/16; G11C 11/412; G11C 11/418; G11C 11/419; G11C 11/54; G11C 11/56; G11C 11/413; G11C 7/12; G11C 8/08; G11C 8/10; G11C 8/18; G06F 7/501; G06N 3/063
(Continued)

(56) References Cited

U.S. PATENT DOCUMENTS 10,748,603 B2 * 8/2020 Sumbul .................. G06N 3/065
11,048,434 B2    6/2021 Kumar et al.
(Continued)

FOREIGN PATENT DOCUMENTS

CN    102087875 A  *  6/2011

*Primary Examiner* — Huan Hoang
*Assistant Examiner* — Minh Dinh
(74) *Attorney, Agent, or Firm* — MORGAN, LEWIS & BOCKIUS LLP

(57) ABSTRACT

An SRAM cell includes a first pass gate transistor connected with a first word-line and a local bit-line, a first inverter that includes an output terminal connected with the first pass gate transistor and an input terminal, a second inverter that includes an input terminal connected with the first pass gate transistor and an output terminal, a second pass gate transistor connected with a second word line, the input terminal of the first inverter and the output terminal of the second inverter, and a complementary local bit-line, a first transistor connected with the second pass gate transistor, a local computing line, and a ground electrode, and a second transistor connected with a third word-line, the local computing line, and the ground electrode.

20 Claims, 21 Drawing Sheets

(51) Int. Cl.
*G11C 11/408* (2006.01)
*G11C 11/4094* (2006.01)

(58) Field of Classification Search
USPC .......................................... 365/191
See application file for complete search history.

(56) References Cited

U.S. PATENT DOCUMENTS

| | | | |
|---|---|---|---|
| 11,269,629 | B2 | 3/2022 | Zhang et al. |
| 2006/0274569 | A1* | 12/2006 | Joshi ..................... G11C 11/412 |
| | | | 365/154 |
| 2014/0078817 | A1* | 3/2014 | Bentum .............. G11C 11/4091 |
| | | | 365/189.11 |
| 2017/0221552 | A1* | 8/2017 | Liaw ....................... H01L 28/00 |
| 2019/0370640 | A1 | 12/2019 | Peng et al. |
| 2020/0381026 | A1 | 12/2020 | Akerib et al. |
| 2021/0158854 | A1 | 5/2021 | Sinangil |
| 2021/0263672 | A1 | 8/2021 | Chang et al. |

\* cited by examiner

FIG. 3B

| Case | Input Data iAct[1:0] | WL Level WLc/WLw | Weight W | Multiplication Result LCL | Multiplication Result LBL | Multiplication Result After Charge-sharing |
|---|---|---|---|---|---|---|
| 1 | Don't care | | 0 | Discharged to CSS or VSS | VSS | VSS |
| 2 | 0 | 0/0 | 1 | Discharged to VSS | VSS | VSS |
| 3 | 1 | 0/1 | 1 | Discharged to VSS | VDD | 1/3 × VDD |
| 4 | 2 | 1/0 | 1 | VDD | VSS | 2/3 × VDD |
| 5 | 3 | 1/1 | 1 | VDD | VDD | VDD |

SRAM CELL CONFIGURED TO PERFORM MULTIPLY-ACCUMULATE (MAC) OPERATION ON MULTI-BIT DATA BASED ON CHARGE SHARING AND METHOD OF OPERATING THE SAME

CROSS-REFERENCE TO RELATED APPLICATIONS

This U.S. non-provisional patent application claims priority under 35 U.S.C. § 119 to Korean Patent Application No. 10-2022-0068464 filed on Jun. 3, 2022, in the Korean Intellectual Property Office, the disclosure of which is incorporated by reference in its entirety herein.

TECHNICAL FIELD

Embodiments of the present disclosure described herein relate to a storage device, and more particularly to a storage device including an SRAM cell.

DISCUSSION OF RELATED ART

A memory and a processor are physically separated in devices of the Von Neumann architecture. Since a location in which data is stored and a location in which an operation is performed are different, a lot of energy (i.e., a lot of power) is required when exchanging the data between the memory and the processor. A device having a computing-in-memory architecture may be used to reduce excessive energy consumption due to exchange of the data.

For example, a device having the computing-in-memory architecture may performing a MAC operation based on a current or using a separate storage element such as a capacitor. However, the device that performs the MAC operation based on the current has a low linear characteristic (i.e., is non-linear). Further, these devices may be expensive to manufacture, take up a large amount of area, and be unable to perform accurate multi-bit operations.

Accordingly, there is a need to develop a device capable of performing the multi-bit operation with high accuracy and good linearity.

SUMMARY

Embodiments of the present disclosure described herein relate to a memory device, and more particularly, relate to a static random access memory (SRAM) cell performing a multiply-accumulate (MAC) operation on multi-bit data and a weight.

Embodiments of the present disclosure provide an SRAM cell configured to perform a MAC operation based on charge sharing.

Embodiments of the present disclosure provide an SRAM cell configured to perform a MAC operation without a separate storage element such as a capacitor.

According to an embodiment, a static random access memory (SRAM) cell includes a first pass gate transistor that includes a gate electrode connected with a first word line, a first end connected with a local bit line, and a second end, a first inverter that includes an output terminal connected with the second end of the first pass gate transistor and an input terminal, a second inverter that includes an input terminal connected with the second end of the first pass gate transistor and an output terminal, a second pass gate transistor that includes a gate electrode connected with a second word line, a first end connected with the input terminal of the first inverter and the output terminal of the second inverter, and a second end connected with a complementary local bit line, a first transistor that includes a gate electrode connected with the first end of the second pass gate transistor, a first end connected with a local computing line, and a second end connected with a ground electrode, and a second transistor that includes a gate electrode connected with a third word line, a first end connected with the local computing line, and a second end connected with the ground electrode.

According to an embodiment, a memory device includes cross-coupled inverters, a first pass gate transistor that transfers a weight stored on a first node of the cross-coupled inverters to a local bit line in response to a LSB of input data, a second pass gate transistor that transfers a complementary weight stored on a second node of the cross-coupled inverters to a complementary local bit line, a first transistor that outputs charges stored on a local computing line to a ground computing line in response to the complementary weight, a second transistor that discharges the charges stored on the local computing line in response to an inverted value of an MSB of the input data, and a read-out circuit. In response to a voltage of the complementary local bit line, the read-out circuit may discharge the charges output to the ground computing line and electrically connects the local computing line and the local bit line.

According to an embodiment, a memory device may include a first SRAM cell that stores a first weight on a first node and a first complementary weight on a second node, the first SRAM cell including a first pass gate transistor that outputs the first weight to a first local bit line in response to an LSB of first input data, a first transistor that connects a first local computing line with a ground electrode in response to the first complementary weight, and a second transistor that connects the first local computing line with the ground electrode in response to an inverted value of an MSB of the first input data, a first read-out circuit that electrically connects the first local computing line and the first local bit line with a global bit line, a second SRAM cell that stores a second weight on a third node and a second complementary weight on a fourth node, the second SRAM cell including a third pass gate transistor that outputs the second weight to a second local bit line in response to an LSB of second input data, a third transistor that connects a second local computing line with the ground electrode in response to the second complementary weight, and a fourth transistor that connects the second local computing line with the ground electrode in response to an inverted value of an MSB of the second input data, and a second read-out circuit that electrically connects the second local computing line and the second local bit line with the global bit line.

BRIEF DESCRIPTION OF THE FIGURES

The above and other objects and features of the present disclosure will become apparent by describing in detail embodiments thereof with reference to the accompanying drawings.

FIG. 3B is a table illustrating a multi-bit MAC operation performed by an SRAM cell of FIG. 2.

DETAILED DESCRIPTION

Below, embodiments of the present disclosure will be described in detail and clearly to such an extent that one of ordinary skill in the art may implement the invention.

In the detailed description, components described with reference to the terms "unit", "module", "block", "~er or ~or", etc. and function blocks illustrated in drawings may be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
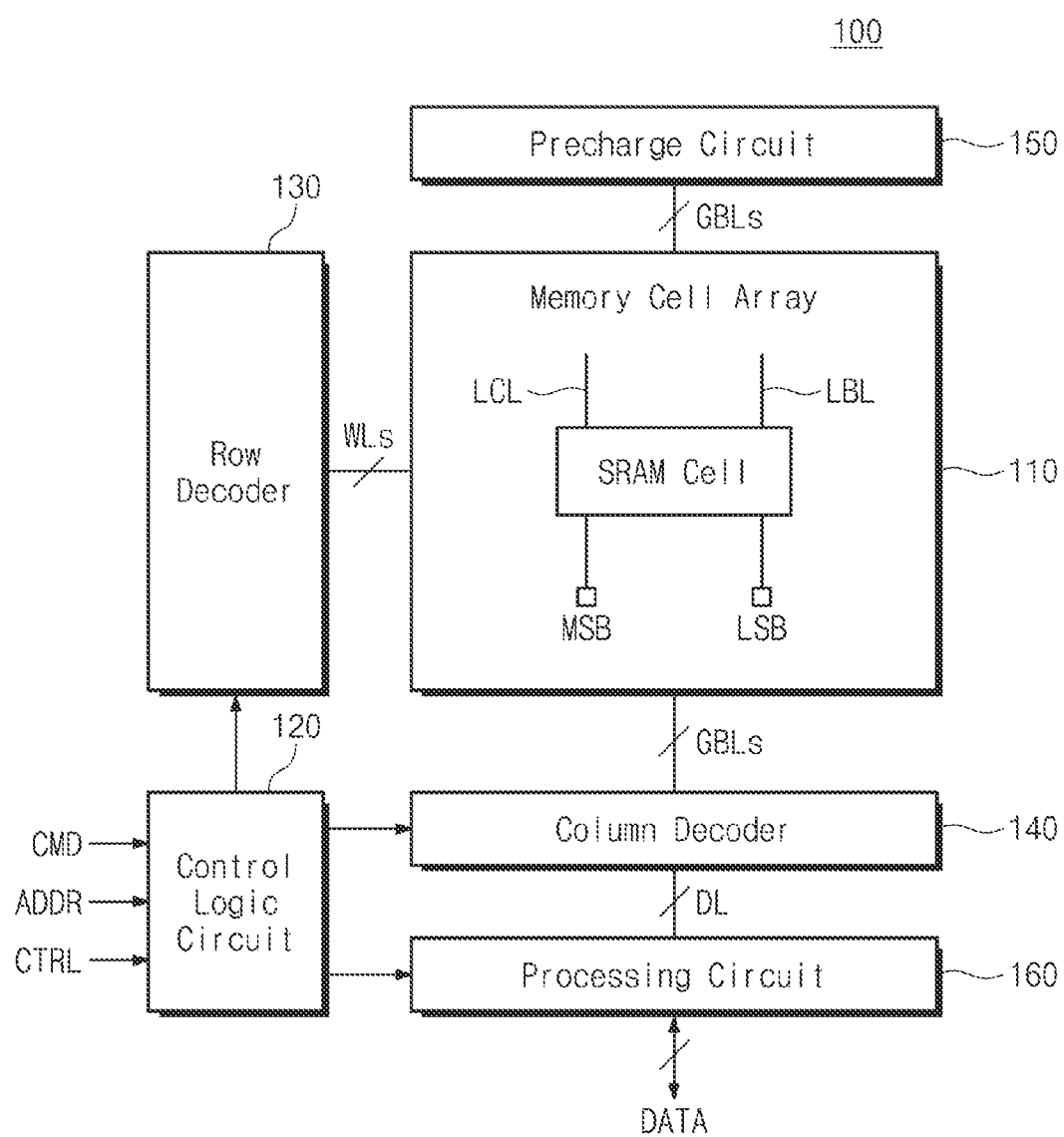
FIG. 1 is a diagram illustrating a configuration of a memory device according to an embodiment of the present disclosure.

FIG. 1 is a diagram illustrating a configuration of a memory device 100 according to an embodiment of the present disclosure. The memory device 100 may include a memory cell array 110, a control logic circuit 120, a row decoder 130 (e.g., decoder circuit), a column decoder 140 (e.g., a decoder circuit), a precharge circuit 150, and a processing circuit 160.

The memory cell array 110 may include memory cells arranged along a plurality of rows and a plurality of columns. For example, a memory cell may be a static random access memory (SRAM), but embodiments of the present disclosure are not limited thereto. The memory cells constituting the memory cell array 110 may be connected with word lines WLs and global bit lines GBLs. In detail, each memory cell may be connected with the global bit line GBL through a local computing line LCL and a local bit line LBL. Each memory cell may store at least one bit (e.g., a weight) input through one or more of the word lines WLs. Through other word lines WLs, each memory cell may receive an inverted value of a most significant bit (MSB) of input data and a least significant bit (LSB) of the input data.

The memory cell according to an embodiment of the present disclosure may perform a multiplication operation on a weight and the multi-bit input data composed of the MSB and the LSB. A result of multiplying the MSB and the weight (hereinafter referred to as a multiplication result of the MSB and the weight) may be output to the local computing line LCL, and a result of multiplying the LSB and the weight (hereinafter referred to as a multiplication result of the LSB and the weight) may be output to the local bit line LBL. The multiplication result of the MSB and the weight (in detail, charges corresponding to the multiplication result) may be stored on the local computing line LCL having a junction capacitance component by the junction between the local computing line LCL and at least one of transistors constituting the memory cell. The multiplication result of the LSB and the weight (in detail, charges corresponding to the multiplication result) may be stored on the local bit line LBL having a junction capacitance component by the junction between the local bit line LBL and at least another one of the transistors constituting the memory cell.

Afterwards, when the local computing line LCL and the local bit line LBL are electrically connected together, a charge sharing may occur so that a total of the charges stored on the local computing line LCL and the local bit line LBL may correspond to a result of multiplying the weight and the multi-bit input data composed of the MSB and the LSB. The charges stored on the local computing line LCL and the local bit line LBL may be output through the global bit line GBL.

The control logic circuit 120 may receive a command CMD, an address ADDR, and a control signal CTRL. The control logic circuit 120 may generate a row address and a column address based on at least one of the command CMD, the address ADDR, and the control signal CTRL. The control logic circuit 120 may provide the row address to the row decoder 130 and may provide the column address to the column decoder 140. In addition, the control logic circuit 120 may control the precharge circuit 150 and the processing circuit 160.

The row decoder 130 may be connected with the memory cell array 110 through the word lines WLs. The row decoder 130 may decode the row address received from the control logic circuit 120 to select and drive one or more of the word lines WLs.

The column decoder 140 may decode the column address received from the control logic circuit 120 and may select the global bit line GBL such that the charges shared by the local computing line LCL and the local bit line LBL are output.

The precharge circuit 150 precharges the local computing line LCL and the local bit line LBL with a preset voltage level or may discharge the local computing line LCL and the local bit line LBL so as to be set to a ground voltage.

The processing circuit 160 may perform the read operation or the write operation on a memory cell, which is selected and driven by the row decoder 130, from among memory cells in a column selected by the column decoder 140. The processing circuit 160 may receive data to be programmed in the selected memory cell. For example, the processing circuit 160 may include a write driver (e.g., a driver circuit) for performing the write operation.

The processing circuit 160 may perform the read operation on the memory cell array 110. In the read operation, the processing circuit 160 may sense a voltage level of the global bit line GBL selected by the column decoder 140 and may convert the sensed voltage level (i.e., an analog signal) into a digital signal. For example, the converted digital signal may include 2-bit data (i.e., the multiplication result of the weight and the input data composed of the MSB and the LSB). The processing circuit 160 may perform shift adding on the converted digital signal, and read data "DATA" of a complete form may be output by the shift adding.

The processing circuit 160 may perform the write operation on the memory cell array 110. In the write operation, the processing circuit 160 may write the data "DATA" received from outside to a memory cell selected by the row decoder 130 and the column decoder 140. For example, a write driver of the processing circuit 160 may perform the write operation.

The SRAM cell according to an embodiment of the present disclosure may perform the multiplication operation on multi-bit data and a weight by using the charge sharing. In particular, the SRAM cell may store the multiplication result therein without a separate storage element such as a capacitor. As such, a data transfer between a processor performing a calculation on data and a memory device storing the data may be omitted, and thus, energy (i.e., power) used during the data transfer may be significantly reduced. In addition, because a separate storage element such as a capacitor is not required, the degree of integration of the SRAM cell may be improved. Further, because the charge sharing is used, the linearity of the MAC result may be secured.

Figure 2:
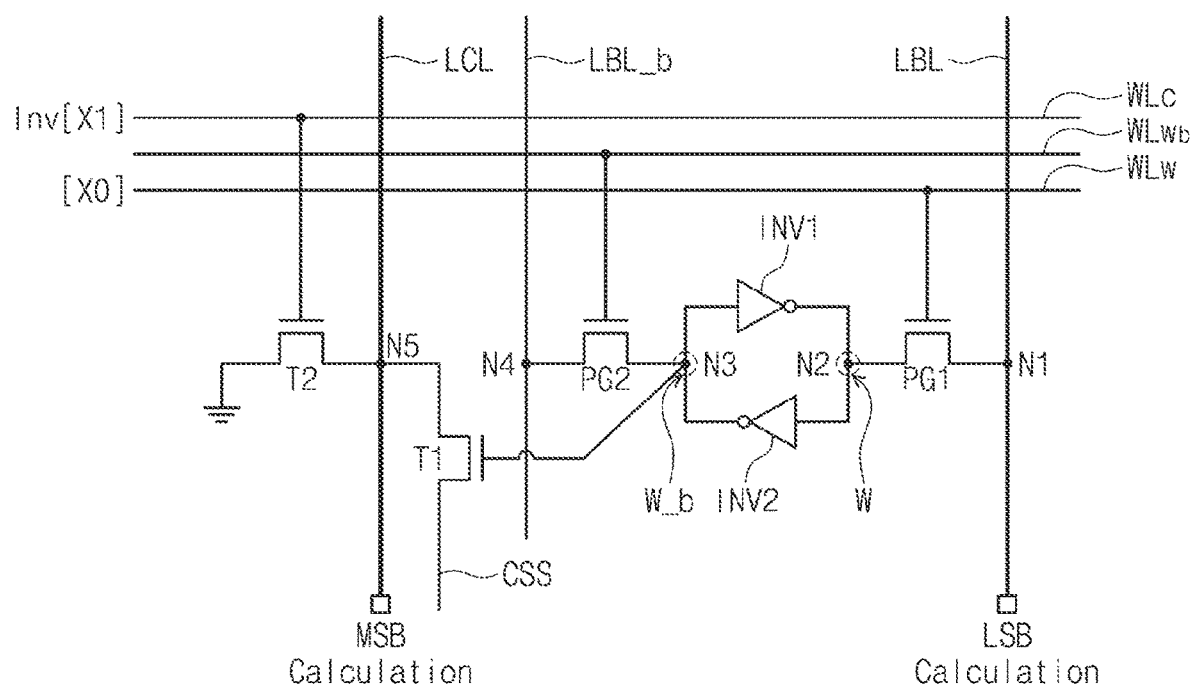
FIG. 2 is a circuit diagram of an SRAM cell according to an embodiment of the present disclosure.

FIG. 2 is a circuit diagram of an SRAM cell according to an embodiment of the present disclosure.

The SRAM cell may include a first transistor T1, a second transistor T2, a first pass gate transistor PG1, a second pass gate transistor PG2, and two PMOS transistors (i.e., pull-up transistors), and two NMOS transistors (i.e., pull-down transistors). One of the PMOS transistors and one of the NMOS transistors may constitute an inverter INV1, and the other of the PMOS transistors and the other of the NMOS transistors may constitute an inverter INV2. That is, the SRAM cell of the present disclosure may be an 8T SRAM cell. For example, inverter INV1 may be implemented by two transistors and inventor INV2 may be implemented by another two transistors. The inverters INV1 and INV2 may be referred to as cross-coupled inverters.

The first pass gate transistor PG1 may include a gate electrode connected with a word line $WL_W$, a first end connected with the local bit line LBL (i.e., a node N1), and a second end connected with an output terminal of the first inverter INV1 and an input terminal of the second inverter INV2 (i.e., a node N2). The second pass gate transistor PG2 may include a gate electrode connected with a word line $WL_{Wb}$, a first end connected with a complementary local bit line LBL_b (i.e., a node N4), and a second end connected with an input terminal of the first inverter INV1 and an output terminal of the second inverter INV2 (i.e., a node N3). The first transistor T1 may include a gate electrode connected with the node N3, a first end connected with the local computing line LCL, and a second end connected with a ground computing line CSS. In an embodiment, the ground computing line CSS is connected with a ground electrode or receives a ground voltage. The second transistor T2 may include a gate electrode connected with a word line $WL_C$, a first end connected with the local computing line LCL, and a second end connected with a ground electrode. The ground electrode may receive a ground voltage.

In an embodiment, the local bit line LBL may have a junction capacitance component by the junction with the first pass gate transistor PG1. Accordingly, the local bit line LBL may store a value (i.e., charges) stored on the node N2 when the first pass gate transistor PG1 is turned on. The local computing line LCL may have a junction capacitance component by the junction with the first transistor T1 and the second transistor T2. Accordingly, when the transistors T1 and T2 are not turned on, the local computing line LCL may store a value (i.e., charges) stored on a node N5.

In an embodiment, the junction capacitance by the junction of the local computing line LCL and the transistors T1 and T2 is two times the junction capacitance by the junction of the local bit line LBL and the transistor PG1. Sizes of transistors and a width and a thickness of each of the local bit line LBL and the local computing line LCL may be considered in the process of manufacturing the SRAM cell such that the junction capacitance of the local computing line LCL is two times the junction capacitance of the local bit line LBL. For example, the sizes of the transistors and widths and thicknesses of each of local bit line LBL and the local computing line LCL may have values that enable the junction capacitance of the local computing line LCL to be two times the junction capacitance of the local bit line LBL.

In an embodiment, the program operation for storing a weight "W" in the SRAM cell may be performed before the multi-bit multiply-accumulate (MAC) operation using the SRAM cell of the present disclosure is performed. Referring to FIGS. 1 and 2, the global bit line GBL may be selected by the column decoder 140, the word lines $WL_{Wb}$ and WLw may be selected by the row decoder 130, and voltage values for turning on the pass gate transistors PG1 and PG2 may be respectively applied to the word lines $WL_{Wb}$ and WLw. To store bit "1" on the node N2, bit "1" may be input to the local bit line LBL connected with the selected global bit line GBL, and bit "0" may be input to the complementary local bit line LBL_b connected with the selected complementary global bit line GBL_b. In contrast, to store bit "0" on the node N2, bit "0" may be input to the local bit line LBL connected with the selected global bit line GBL, and bit "1" may be input to the complementary local bit line LBL_b connected with the selected complementary global bit line GBL_b.

In an embodiment, to perform the multi-bit MAC operation using the SRAM cell according to an embodiment of the present disclosure, an inverted value (i.e., Inv[X1]) of the MSB of the multi-bit input data and the LSB (i.e., [X0]) of the multi-bit input data may be respectively input to the word lines WLc and WLw. For example, the memory cell array 110 or the row decoder 130 may include an inverter for inverting the MSB of the multi-bit input data.

A logical value of the node N5 may depend on an initial value of the voltage of the local computing line LCL and the inverted value Inv[X1] of the MSB of the multi-bit input data. In addition, the logical value of the node N5 may depend on the initial value of the voltage of the local computing line LCL and a logical value of the node N3 (i.e., a complementary weight W_b). The reason is that the local computing line LCL is discharged by the turn-on of the first transistor T1 or the second transistor T2 and the initial value of the voltage of the local computing line LCL determines the voltage of the local computing line LCL. In other words, a voltage value corresponding to charges stored on the local computing line LCL may indicate a result of performing the multiplication operation on the MSB of the multi-bit input data and the weight "W". In an embodiment, before the multiplication operation is performed by using the local computing line LCL, the local computing line LCL may be precharged by the precharge circuit 150.

A logical value of the node N1 may depend on a logical value (i.e., the weight "W") of the node N2 and the LSB (i.e., [X0]) of the multi-bit input data. In other words, a voltage value corresponding to charges stored on the local bit line LBL may indicate a result of performing the multiplication operation on the LSB of the multi-bit input data and the weight "W". In an embodiment, before the multiplication operation is performed by using the local bit line LBL, the local bit line LBL may be precharged by the precharge circuit 150.

According to the above description, the multiplication operation of the 2-bit input data and the weight, which is performed by the SRAM cell, may be expressed by Equation 1 below. Herein, iAct[1:0] represents 2-bit input data, iAct[1] represents the MSB of the 2-bit input data, iAct[0] represents the LSB of the 2-bit input data, and W[n] represents a weight.

$$iAct[1:0] \times W[n] = (\overline{iAct[1]} + \overline{W[n]}) \times 2 + (iAct[0] \cdot W[n]) \quad \text{[Equation 1]}$$

In Equation 1 above, $(\overline{iAct[1]} + \overline{W[n]})$ represents the MSB multiplication operation (or calculation) performed on the local computing line LCL, and (iAct[0]·W[n]) represents the LSB multiplication operation (or calculation) performed on the local bit line LBL. In addition, "2" multiplied by $(\overline{iAct[1]} + \overline{W[n]})$ represents that the junction capacitance by the junction of the local computing line LCL and the transistors T1 and T2 is two times the junction capacitance by the junction of the local bit line LBL and the transistor PG1. For example, the multiplication operation that is performed on input data of "01" and a weight of "1" may be calculated as follows: $01 \times 1 = (\overline{0} + \overline{1}) \times 2 + (1 \cdot 1) = 01$.

After the multiplication operations are performed by using the local computing line LCL and the local bit line LBL, the local computing line LCL and the local bit line LBL are electrically connected to one another, and thus, a charge sharing occurs between the local computing line LCL and the local bit line LBL. A sum of the multiplication result of the MSB of the multi-bit input data and the weight and the multiplication result of the LSB of the multi-bit input data and the weight may be obtained by the charge sharing. This will be more fully described below.

Figure 3A:
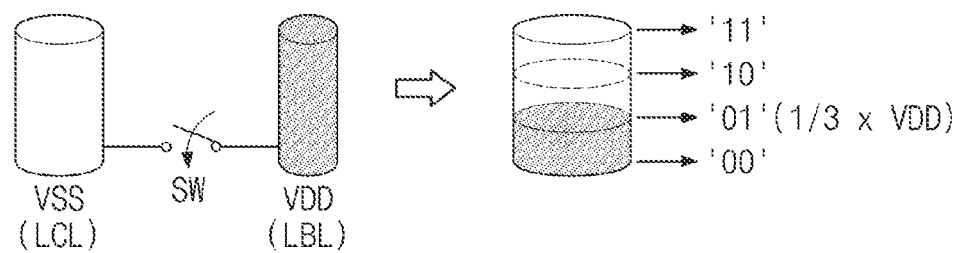
FIG. 3A is a diagram illustrating charge sharing between a local bit line and a local computing line of FIG. 2.

FIG. 3A is a diagram illustrating charge sharing between the local bit line LBL and the local computing line LCL of FIG. 2.

Referring to FIG. 3A, there is illustrated an example where a voltage value of the local computing line LCL is "0" (i.e., VSS) because charges are absent from the local computing line LCL and a voltage value of the local bit line LBL is "1" (i.e., VDD) because charges are fully charged on the local bit line LBL. When a switch SW is turned on, a charge sharing occurs between the local computing line LCL and the local bit line LBL. According to the assumption described with reference to FIG. 2, when the capacitance of the local computing line LCL is two times the capacitance of the local bit line LBL, a voltage value after the charge sharing may be "⅓×VDD", which corresponds to bits "01".

Although not illustrated in drawing, when the voltage value of the local computing line LCL is "0" (i.e., VSS) and the voltage value of the local bit line LBL is also "0" (i.e., VSS), the voltage value after the charge sharing may be "0", which corresponds to bits "00". When the voltage value of the local computing line LCL is "1" (i.e., VDD) and the voltage value of the local bit line LBL is also "0" (i.e., VSS), the voltage value after the charge sharing may be "⅔× VDD", which corresponds to bits "10". When the voltage value of the local computing line LCL is "1" (i.e., VDD) and the voltage value of the local bit line LBL is also "1" (i.e., VDD), the voltage value after the charge sharing may be "VDD", which corresponds to bits "11".

FIG. 3B is a table illustrating a multi-bit MAC operation performed by an SRAM cell of FIG. 2.

The input data iAct[1:0] may be composed of 2 bits, the inverted value Inv[X1] of the MSB of the input data may be input to the word line $WL_C$, and the LSB (i.e., [X0]) of the input data may be input to the word line WLW. The weight "W" may be composed of one bit; as described with reference to FIG. 2, the weight "W" may be stored in the SRAM cell in advance before the MAC operation.

Case 1 shows values and voltages associated with the MSB multiplication operation using the local computing line LCL and the LSB multiplication operation using the local bit line LBL, when the weight "W" is "0".

Referring to the MSB multiplication operation using the local computing line LCL, because the first transistor T1 is turned on by a value (i.e., "1") stored on the node N3, charges stored on the local computing line LCL with the junction capacitance component may be discharged through the ground computing line CSS (i.e., the local computing line LCL may be set to "VSS"). Alternatively, when the MSB of the input data is "0", the second transistor T2 may be turned on by the inverted value Inv[X1] of the MSB of the input data, and thus, charges stored on the local computing line LCL may be discharged through the second transistor T2 (i.e., the local computing line LCL may be set to "VSS").

Referring to the LSB multiplication operation using the local bit line LBL, the voltage value of the local bit line LBL may be "VSS" regardless of a value of the LSB (i.e., [X0]) of the input data. The reason is as follows. An initial value of the local bit line LBL may be "0" by the discharge operation of the precharge circuit 150 (refer to FIG. 1); even though the first pass gate transistor PG1 is turned on by the LSB input to the word line $WL_W$, and "0" stored on the node N2 is output to the local bit line LBL.

Afterwards, when the charge sharing occurs between the local computing line LCL and the local bit line LBL, the voltage values of the local computing line LCL and the local bit line LBL may be "VSS".

Case 2 shows values and voltages associated with the MSB multiplication operation using the local computing line LCL and the LSB multiplication operation using the local bit line LBL, when the weight "W" is "1" and the input data are "00".

Referring to the MSB multiplication operation using the local computing line LCL, because "1" being the inverted value Inv [X1] of the MSB of the input data is input to the second transistor T2 through the word line $WL_C$, the second transistor T2 is turned on. Accordingly, the local computing line LCL may be discharged to "VSS" (e.g., a ground voltage). Referring to the LSB multiplication operation using the local bit line LBL, because "0" being a value of the LSB of the input data is input to the first pass gate transistor PG1 through the word line $WL_W$, the first pass gate transistor PG1 is turned off. Accordingly, the local bit line LBL may maintain "VSS" at an initial value. Afterwards, when the charge sharing occurs between the local computing line LCL and the local bit line LBL, the voltage values of the local computing line LCL and the local bit line LBL may be "VSS".

Case 3 shows values and voltages associated with the MSB multiplication operation using the local computing line LCL and the LSB multiplication operation using the local bit line LBL, when weight "W" is "1" and the input data are "01".

Referring to the MSB multiplication operation using the local computing line LCL, because "1" being the inverted value Inv[X1] of the MSB of the input data is input to the second transistor T2 through the word line $WL_C$, the second transistor T2 is turned on. Accordingly, the local computing line LCL may be discharged to "VSS". Referring to the LSB multiplication operation using the local bit line LBL, because "1" being a value of the LSB of the input data is input to the first pass gate transistor PG1 through the word line $WL_W$, the first pass gate transistor PG1 is turned on. Accordingly, "1" stored on the node N2 is output to the local bit line LBL, and thus, the voltage of the local bit line LBL is "VDD". Afterwards, when the charge sharing occurs between the local computing line LCL and the local bit line LBL, because the capacitance of the local computing line LCL is two times the capacitance of the local bit line LBL, the voltages of the local computing line LCL and the local bit line LBL may be "⅓×VDD".

Case 4 shows values and voltages associated with the MSB multiplication operation using the local computing line LCL and the LSB multiplication operation using the local bit line LBL, when the weight "W" is "1" and the input data are "10".

Referring to the MSB multiplication operation using the local computing line LCL, because "0" being the inverted value Inv[X1] of the MSB of the input data is input to the second transistor T2 through the word line $WL_C$, the second transistor T2 is turned off. Also, the first transistor T1 is turned off by the complementary weight W_b stored on the node N3. Accordingly, the local computing line LCL may maintain "VDD" at an initial value. Referring to the LSB multiplication operation using the local bit line LBL, because "0" being a value of the LSB of the input data is input to the first pass gate transistor PG1 through the word line $WL_W$, the first pass gate transistor PG1 is turned off. Accordingly, the local bit line LBL may maintain "VSS" at an initial value. Afterwards, when the charge sharing occurs between the local computing line LCL and the local bit line LBL, the voltage values of the local computing line LCL and the local bit line LBL may be "⅔×VDD".

Case 5 shows values and voltages associated with the MSB multiplication operation using the local computing line LCL and the LSB multiplication operation using the local bit line LBL, when the weight "W" is "1" and the input data are "11".

Referring to the MSB multiplication operation using the local computing line LCL, because "0" being the inverted value Inv[X1] of the MSB of the input data is input to the second transistor T2 through the word line $WL_C$, the second transistor T2 is turned off. Also, the first transistor T1 is turned off by the complementary weight W_b stored on the node N3. Accordingly, the local computing line LCL may maintain "VDD" at an initial value. Referring to the LSB multiplication operation using the local bit line LBL, because "1" being a value of the LSB of the input data is input to the first pass gate transistor PG1 through the word line $WL_W$, the first pass gate transistor PG1 is turned on. Accordingly, "1" stored on the node N2 is output to the local bit line LBL, and thus, the voltage of the local bit line LBL is "VDD". Afterwards, when the charge sharing is made between the local computing line LCL and the local bit line LBL, the voltages of the local computing line LCL and the local bit line LBL may be "VDD".

Figure 4:
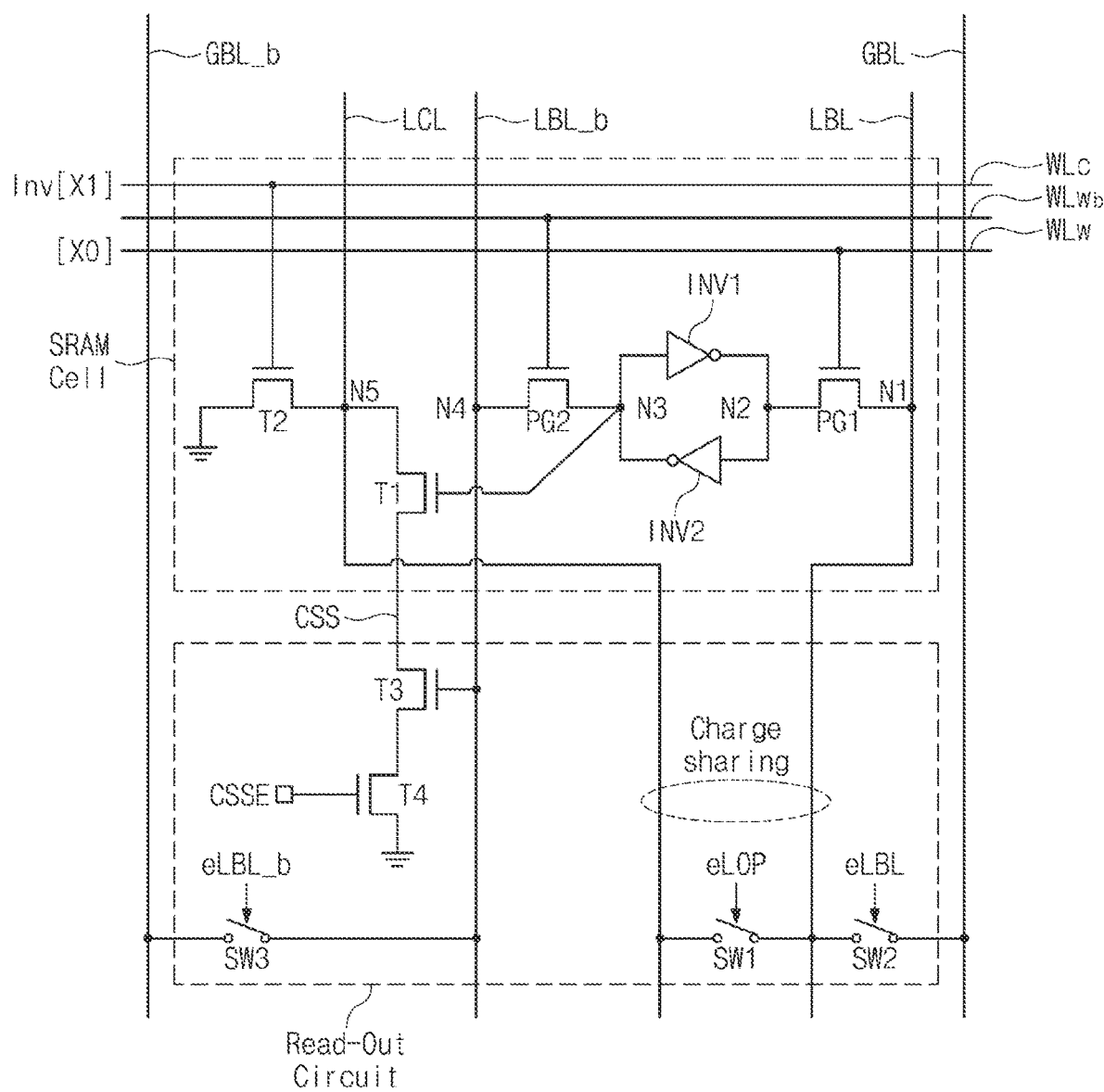
FIG. 4 is a circuit diagram of an SRAM cells and a read-out circuit according to an embodiment of the present disclosure.

FIG. 4 is a circuit diagram of an SRAM cells and a read-out circuit according to an embodiment of the present disclosure. The SRAM cell of FIG. 4 may be identical to the SRAM cell of FIG. 2, and the read-out circuit may output a result of the MAC operation that is performed by the SRAM cell.

The read-out circuit may include transistors T3 and T4 and switches SW1, SW2, and SW3. The transistor T3 may operate in response to the voltage of the node N4, and a first end of the transistor T3 may be connected with the ground computing line CSS. The transistor T4 may operate in response to a voltage CSSE and may include a first end connected with a second end of the transistor T3 and a second end connected with the ground electrode.

The switch SW1 electrically connects the local computing line LCL and the local bit line LBL in response to a signal eLOP. For example, when the switch SW1 is implemented by a transistor, the signal eLOP may be supplied to its gate electrode. In this case, the charge sharing may occur between the local computing line LCL and the local bit line LBL, and thus, a multiplication result of the MSB and the weight and a multiplication result of the LSB and the weight may be added.

The switch SW2 may output a charge sharing result (i.e., a sum of the multiplication result of the MSB and the weight and the multiplication result of the LSB and the weight) to the global bit line GBL in response to a signal eLBL. For example, when the switch SW2 is implemented by a transistor, the signal eLBL may be supplied to its gate electrode.

The switch SW3 may electrically connect a complementary local bit line LBL_b and the complementary global bit line GBL_b in response to a signal eLBL_b and may output the complementary weight W_b stored on the node N3 to the complementary global bit line GBL_b. For example, when the switch SW3 is implemented by a transistor, the signal eLBL_b may be supplied to its gate electrode.

For example, each of the switches SW1, SW2, and SW3 may be composed of at least one PMOS transistor and/or at least one NMOS transistor. For example, the signals eLOP, eLBL, and eLBL_b controlling the switches SW1, SW2, and SW3 may be generated by the control logic circuit 120 (refer to FIG. 1) and/or the row decoder 130 (refer to FIG. 1). The switches SW1 and SW2 are illustrated in FIG. 4 as components of the read-out circuit, but may be regarded as components of the SRAM cell.

Figure 5A:
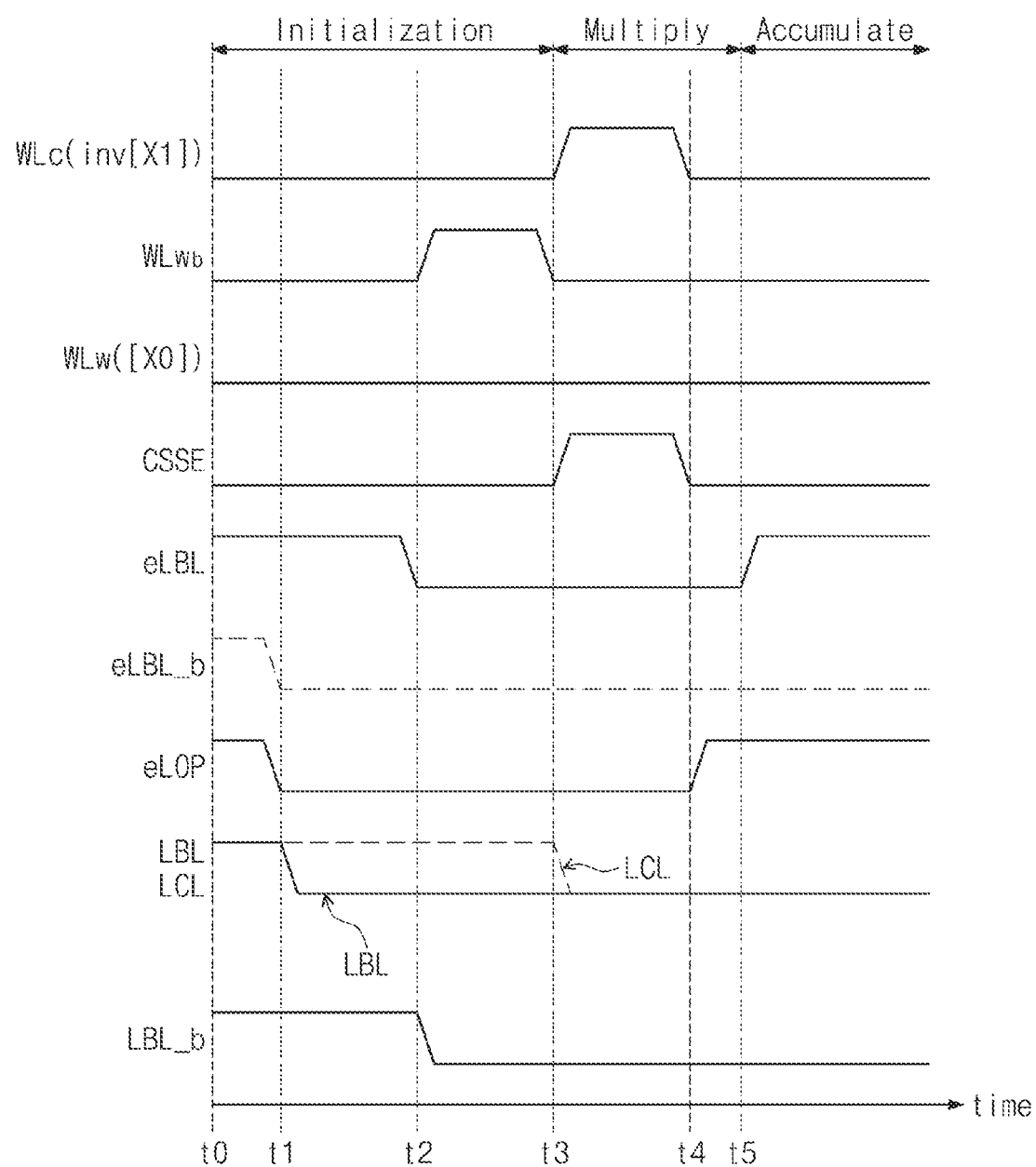
FIGS. 5A and 5B are timing diagrams for describing operations of an SRAM cell and a read-out circuit of FIG. 4.
Figure 5B:
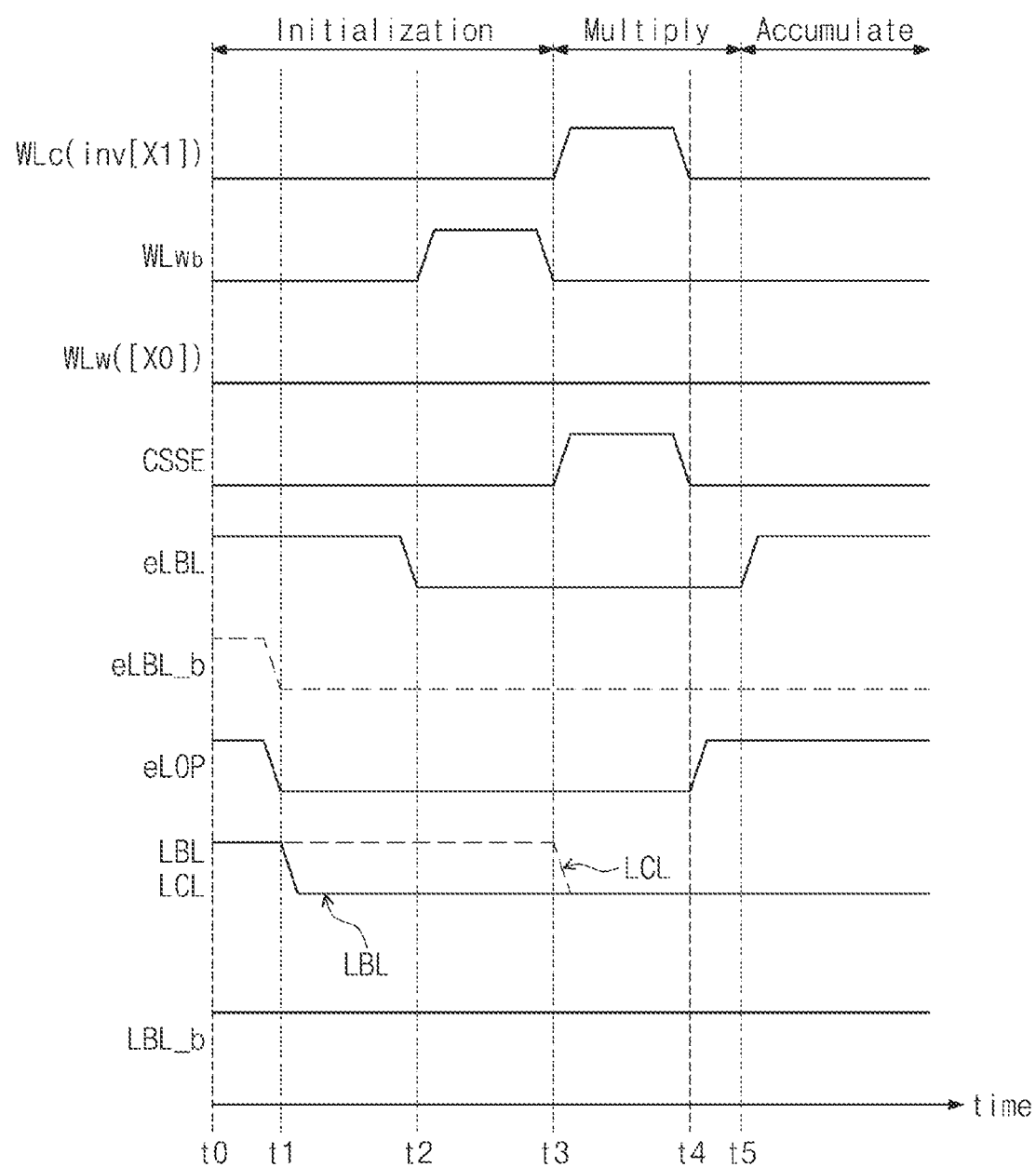

FIGS. 5A and 5B are timing diagrams for describing operations of an SRAM cell and a read-out circuit of FIG. 4. In detail, FIG. 5A shows a timing diagram associated with the case where input data are "00" and the weight is "1", and FIG. 5B shows a timing diagram associated with the case where input data are "00" and the weight is "0".

Referring to FIGS. 1, 4, and 5A, during a time period from t0 to t3, the initialization of the SRAM cell may be performed; during a time period from t3 to t5, multiplication operations may be performed, and results of the multiplication operations may be added by the charge sharing after t5.

First, to initialize the local computing line LCL, the local bit line LBL, and the complementary local bit line LBL_b, during a time period from t0 to t1, the signals eLOP and eLBL_b may be activated such that the switches SW1 and SW3 are turned on. During a time period from t0 to t3, the signal eLBL may be activated such that the switch SW2 is turned on.

During a time period from t1 to t3, the local computing line LCL may be precharged by the precharge circuit 150, and the local bit line LBL may be discharged by the precharge circuit 150. According to the above description, the initial value (i.e., "1") for the MSB multiplication operation using the local computing line LCL may be stored on the local computing line LCL, and the initial value (i.e., "0") for the LSB multiplication operation using the local bit line LBL may be stored on the local bit line LBL.

During a time period from t2 to t3, when "1" is input to the word line $WL_{Wb}$, the second pass gate transistor PG2 may be turned on, and thus, the complementary weight W_b (i.e., "0") stored on the node N3 may be output to the complementary local bit line LBL_b. In this case, the transistor T3 may be turned off by the complementary weight W_b (i.e., "0").

During a time period from t3 to t4, when the inverted value (i.e., Inv[X1]="1") of the MSB of the input data is input to the second transistor T2 through the word line $WL_C$, the second transistor T2 may be turned on. In this case, when the local computing line LCL is discharged, the voltage of the local computing line LCL may transition from "1" to "0". As described with reference to FIGS. 2 and 3B, a result of the MSB multiplication operation performed during a time period from t3 to t4 may be stored on the local computing line LCL, and a result of the LSB multiplication operation may be stored on the local bit line LBL.

During a time period from t4 to t5, since the signal eLOP is activated, the switch SW1 is turned on, and thus, the charge sharing occurs between the local computing line LCL and the local bit line LBL. Because the junction capacitance by the junction of the local computing line LCL and the transistors T1 and T2 is two times the junction capacitance by the junction of the local bit line LBL and the first pass gate transistor PG1, the amount of shared charges may be a sum of the multiplication result of the MSB and the weight and the multiplication result of the LSB and the weight.

Afterwards, in a time period after t5, the signal eLBL may be activated, and thus, the shared charges may be output to the global bit line GBL.

The timing diagram of FIG. 5B is identical to the timing diagram of FIG. 5A except for the waveform of the complementary local bit line LBL_b, and thus, additional description will be omitted to avoid redundancy.

Referring to the waveform of the complementary local bit line LBL_b, which is different from that of FIG. 5A, because the complementary weight W_b stored on the node N3 is "1", the voltage of the complementary local bit line LBL_b may maintain "1" over the entire time period after t0. As a result, during a time period from t2 to t3, the second pass gate transistor PG2 is turned on by a signal input to the word line $WL_{Wb}$; when the signal CSSE is activated at t3, the transistor T4 is turned on, and thus, the local computing line LCL is discharged from t3. In this case, the voltage of the local computing line LCL may transition from "1" to "0".

Figure 6A:
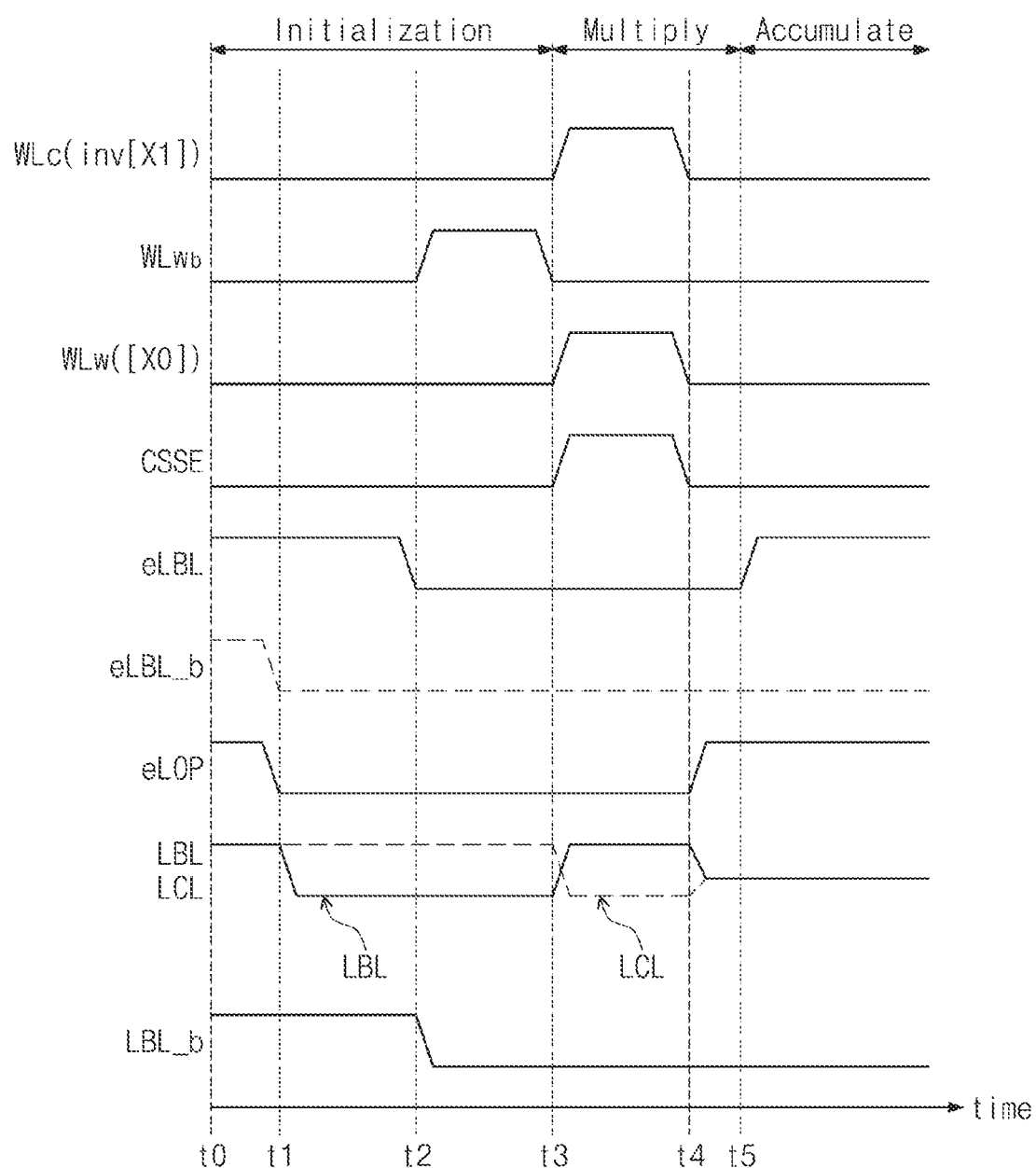
FIGS. 6A and 6B are timing diagrams for describing operations of an SRAM cell and a read-out circuit of FIG. 4.
Figure 6B:
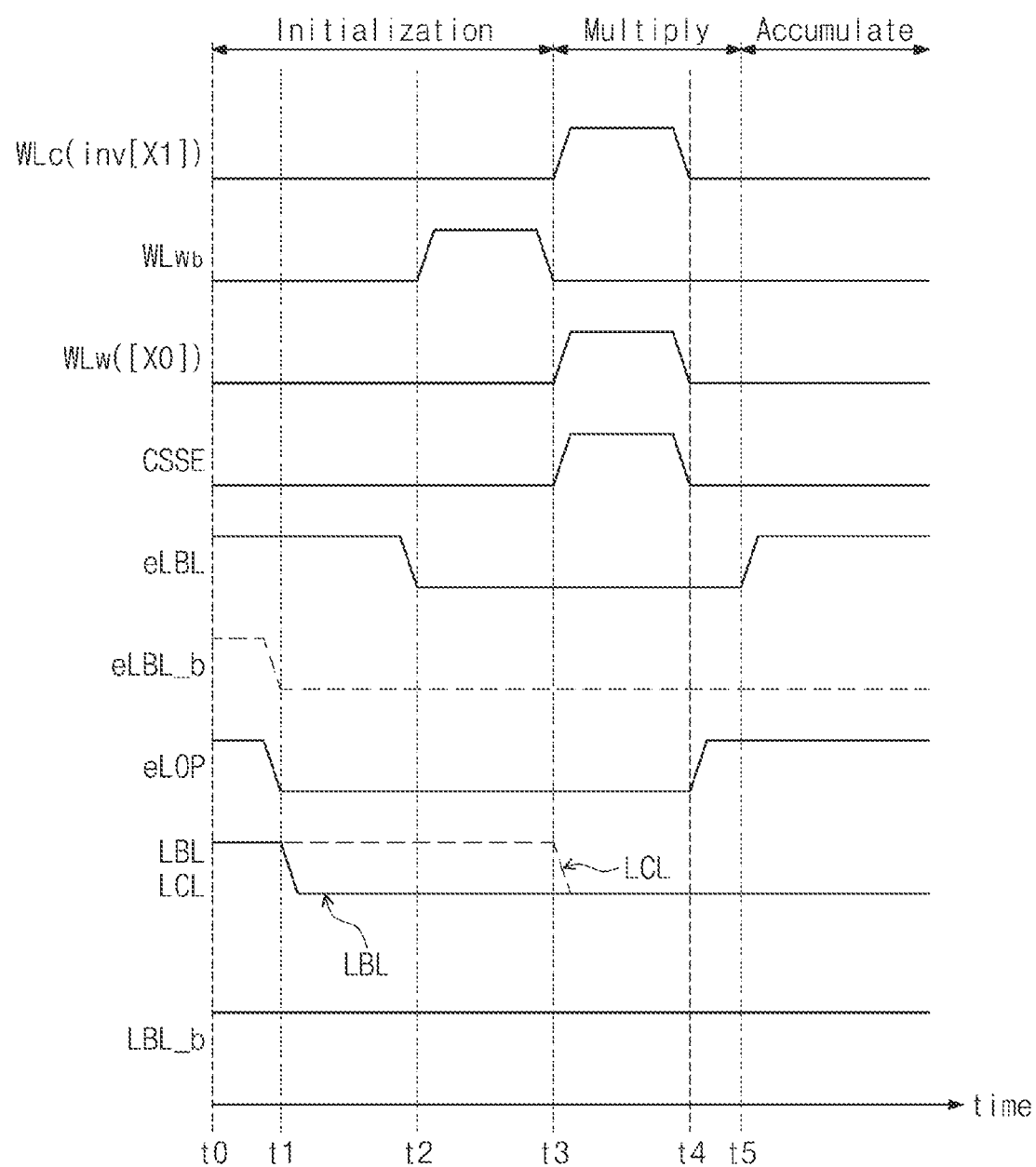

FIGS. 6A and 6B are timing diagrams for describing operations of an SRAM cell and a read-out circuit of FIG. 4. In detail, FIG. 6A shows a timing diagram associated with the case where input data are "01" and the weight is "1", and FIG. 6B shows a timing diagram associated with the case where input data are "01" and the weight is "0".

First, referring to FIG. 6A, because the MSB of the input data is "0" and the weight "W" is "1", the MSB multiplication operation using the local computing line LCL is identical to that described with reference to FIG. 5A, and thus, additional description will be omitted to avoid redundancy.

During a time period from t3 to t4, "1" being the LSB (i.e., X[0]) of the input data is input to the first pass gate transistor PG1 through the word line $WL_W$. In this case, "1" being the weight "W" stored on the node N2 may be output to the local bit line LBL, and thus, the voltage level of the local bit line LBL may be set to "1".

Afterwards, at t4 at which the signal eLOP is activated, the local computing line LCL and the local bit line LBL are electrically connected to one another, and thus, the voltage levels of the local computing line LCL and the local bit line LBL may be "⅓×VDD".

Referring to FIG. 6B, because the complementary weight W_b stored on the node N3 is "1", the voltage of the complementary local bit line LBL_b may maintain "1" over the entire time period after t0. As a result, when the second pass gate transistor PG2 and the transistor T4 are turned on, the local computing line LCL is discharged from t3, and thus, the voltage of the local computing line LCL may transition from "1" to "0".

During a time period from t3 to t4, "1" being the LSB (i.e., X[0]) of the input data is input to the first pass gate transistor PG1 through the word line WLW. In this case, "0" being the weight "W" stored on the node N2 may be output to the local bit line LBL, and thus, the voltage level of the local bit line LBL may be set to "0". Accordingly, even though the charge sharing occurs between the local computing line LCL and the local bit line LBL at t4, the voltage values of the local computing line LCL and the local bit line LBL may maintain "0".

Figure 7A:
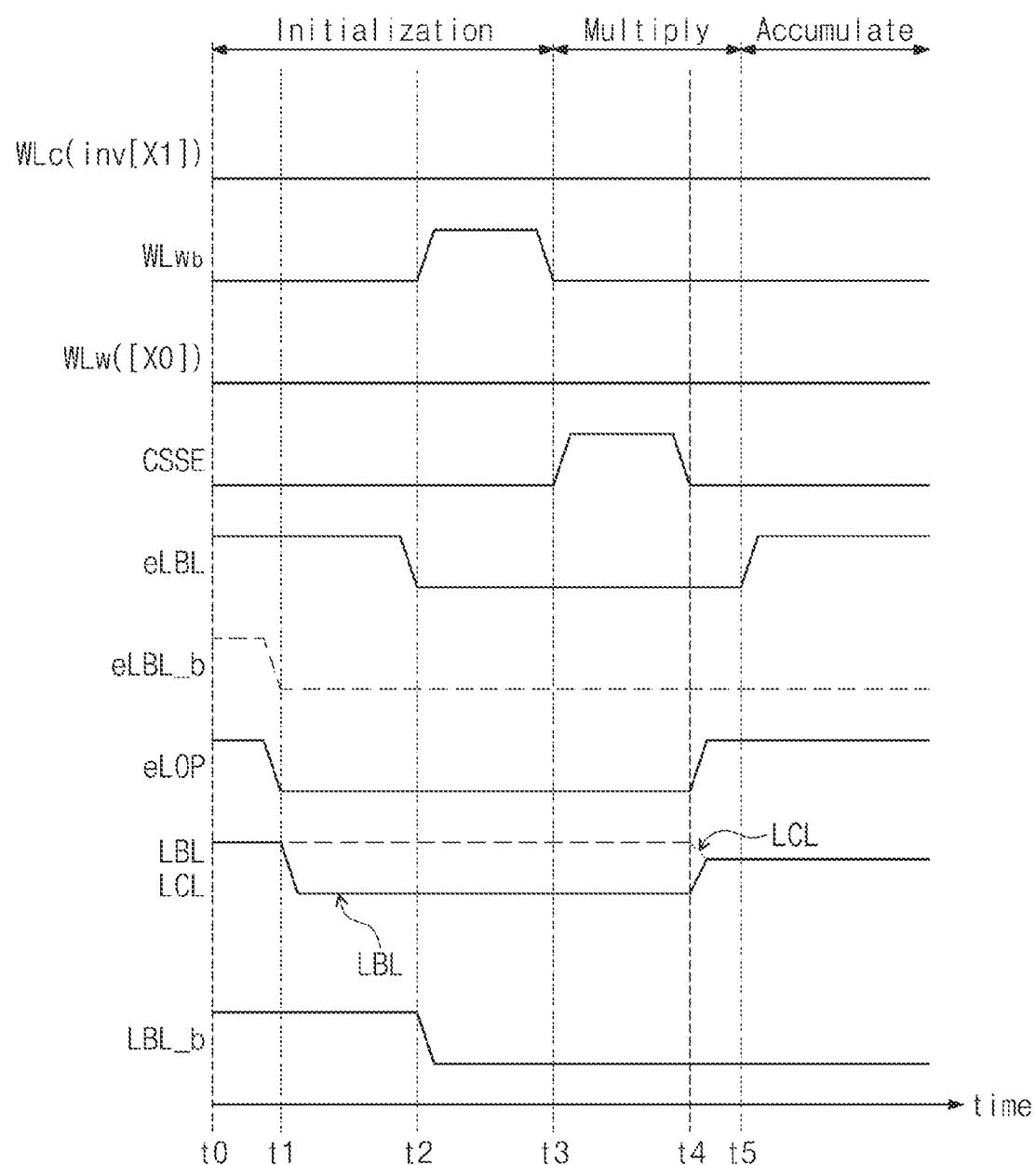
FIGS. 7A and 7B are timing diagrams for describing operations of an SRAM cell and a read-out circuit of FIG. 4.
Figure 7B:
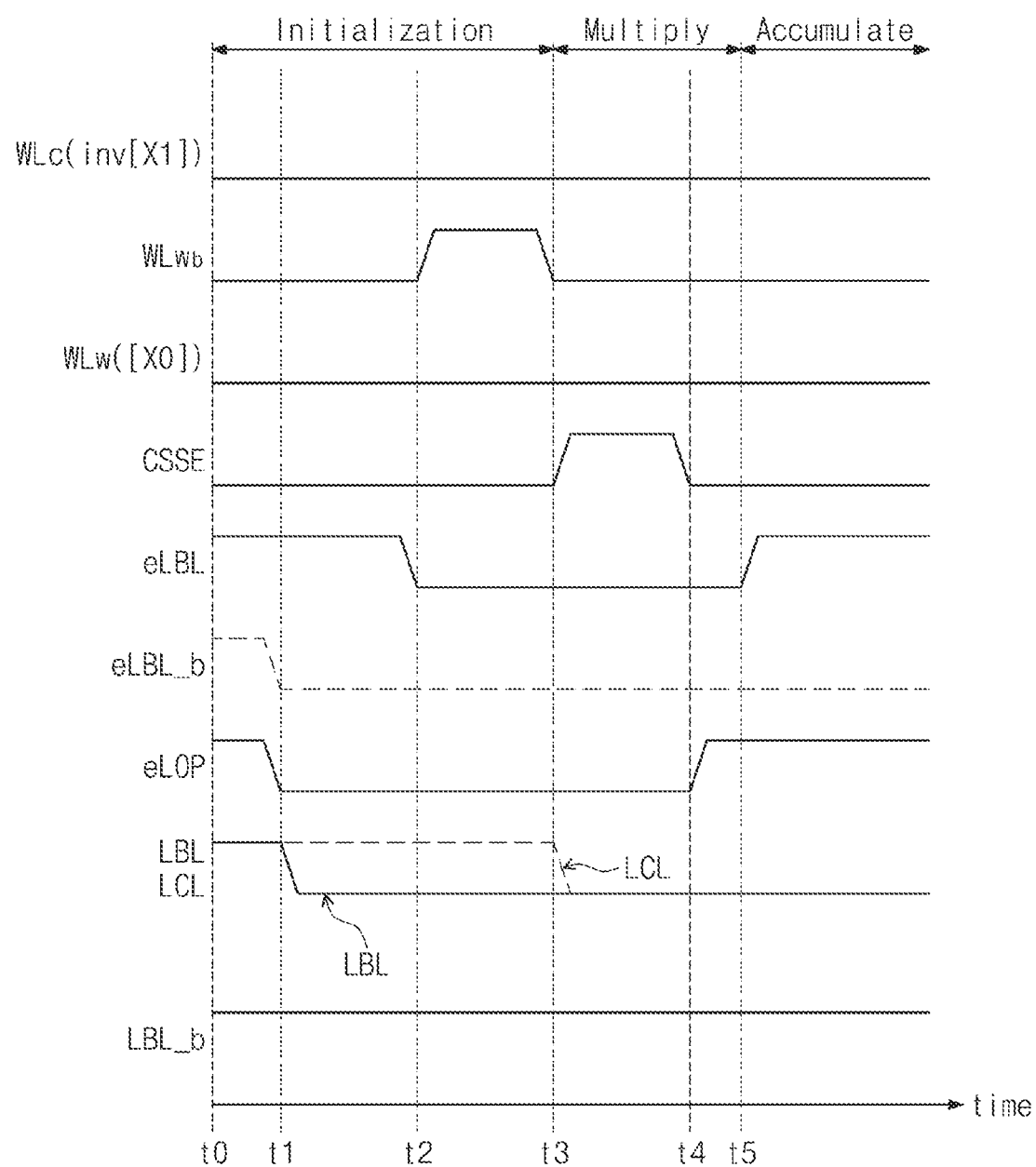

FIGS. 7A and 7B are timing diagrams for describing operations of an SRAM cell and a read-out circuit of FIG. 4. In detail, FIG. 7A shows a timing diagram associated with the case where input data are "10" and the weight is "1", and FIG. 7B shows a timing diagram associated with the case where input data are "10" and the weight is "0". Waveforms of FIGS. 7A and 7B are partially similar to the waveforms described with reference to FIGS. 5A, 5B, 6A, and 6B, and thus, additional description will be omitted to avoid redundancy.

Because the inverted value (i.e., Inv[X1]) of the MSB of the input data is "0", the second transistor T2 is turned off over the entire time period. Also, because the complementary weight W_b stored on the node N3 is "0", even though the second pass gate transistor PG2 is turned on a time period from t2 to t3, the transistor T3 is not turned on. In this case, during a time period from t1 to t4, the voltage level of the local computing line LCL may maintain "1" being the initial value. Because "0" being the LSB (i.e., [X0]) of the input data is input to the word line $WL_W$ over the entire time period, the first pass gate transistor PG1 is turned off, and thus, the voltage level of the local bit line LBL maintains "0" being the initial value.

Afterwards, at t4 at which the signal eLOP is activated, the local computing line LCL and the local bit line LBL are electrically connected together, and thus, the voltage levels of the local computing line LCL and the local bit line LBL may be "⅔×VDD".

Referring to FIG. 7B, during a time period from t3 to t4, because the inverted value (i.e., Inv[X1]) of the MSB of the input data is "0", the second transistor T2 is turned off over the entire time period. Also, because the complementary weight W_b stored on the node N3 is "0", even though the second pass gate transistor PG2 is turned on during a time period from t2 to t3, the transistor T3 is not turned on. In this case, during a time period from t1 to t4, the voltage level of the local computing line LCL may maintain "1" being the initial value.

During a time period from t2 to t3, the second pass gate transistor PG2 is turned on by a signal input to the word line $WL_{Wb}$, and the first transistor T1 is turned on by "1" being the complementary weight W_b stored on the node N3. During a time period from t3 to t4, the transistor T4 may be turned on by the signal CSSE, and thus, the voltage level of the local computing line LCL may be set to "0".

In the case of the local bit line LBL, because the LSB (i.e., [X0]) of the input data is "0", the first pass gate transistor PG1 may be turned off over the entire time period, and thus, the voltage level of the local bit line LBL may maintain "0".

Accordingly, even though the charge sharing occurs between the local computing line LCL and the local bit line LBL at t4, the voltage values of the local computing line LCL and the local bit line LBL may maintain "0".

Figure 8A:
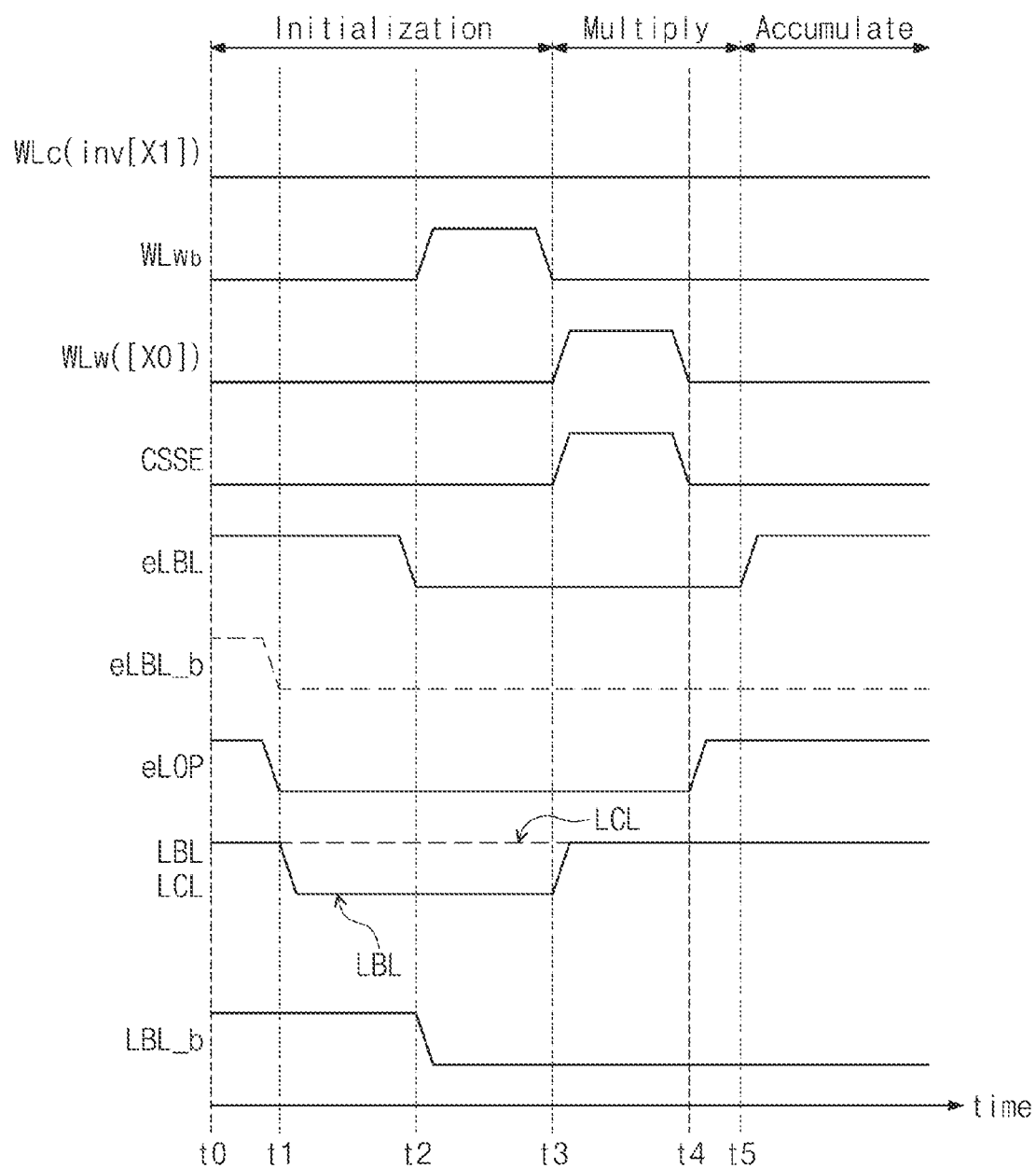
FIGS. 8A and 8B are timing diagrams for describing operations of an SRAM cell and a read-out circuit of FIG. 4.
Figure 8B:
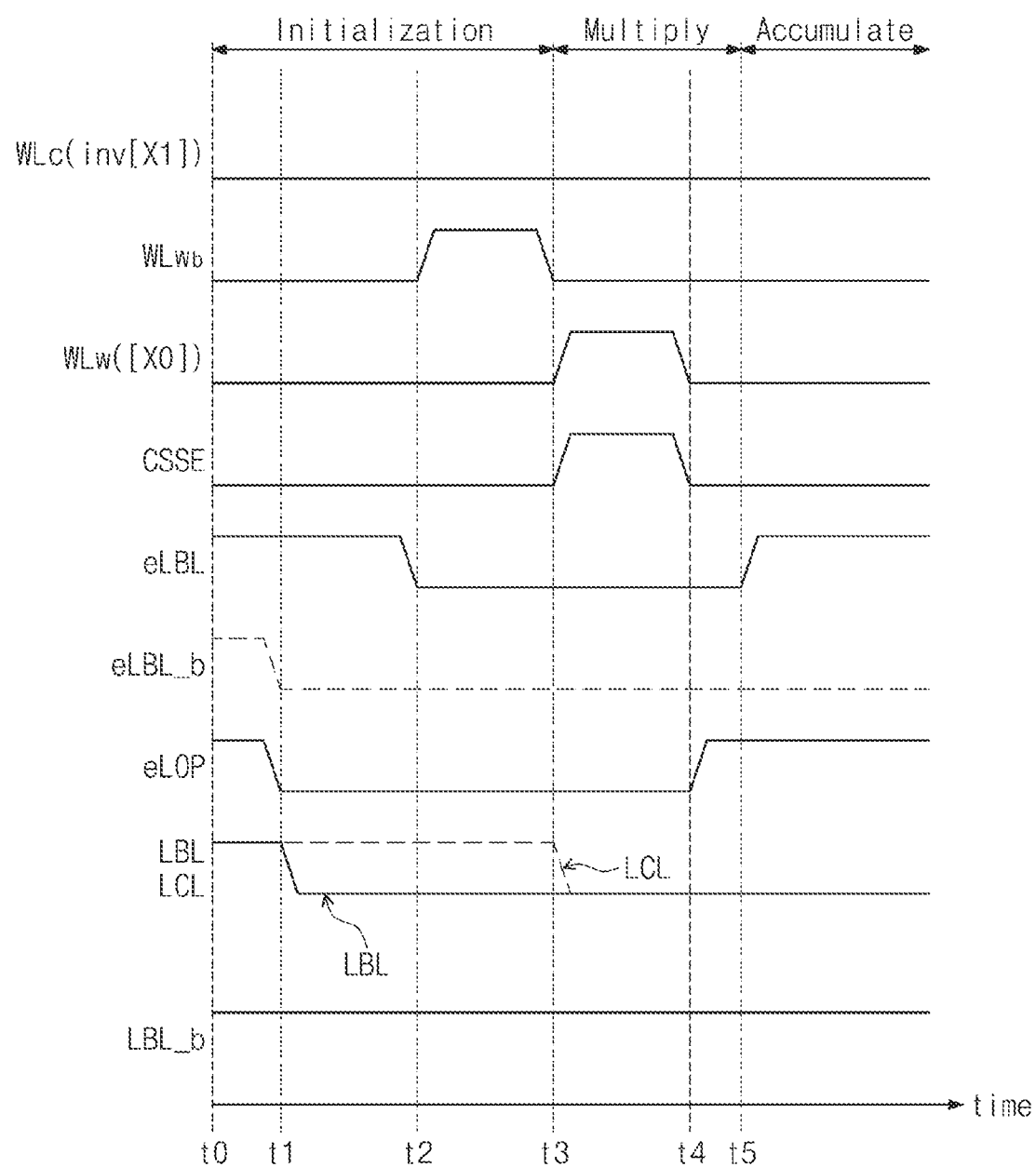

FIGS. 8A and 8B are timing diagrams for describing operations of an SRAM cell and a read-out circuit of FIG. 4. In detail, FIG. 8A shows a timing diagram associated with the case where input data are "11" and the weight is "1", and FIG. 8B shows a timing diagram associated with the case where input data are "11" and the weight is "0".

Referring to FIG. 8A, because the inverted value (i.e., Inv[X1]) of the MSB of the input data is "0", the second transistor T2 is turned off over the entire time period. Also, because the complementary weight W_b stored on the node N3 is "0", even though the second pass gate transistor PG2 is turned on during a time period from t2 to t3, the transistor T3 is not turned on. In this case, during a time period from t1 to t4, the voltage level of the local computing line LCL may maintain "1" the initial value.

During a time period from t3 to t4, "1" being the LSB (i.e., [X0]) of the input data is input to the word line $WL_W$, and thus, the first pass gate transistor PG1 is turned on. In this case, "1" being the weight "W" stored on the node N1 is output to the local bit line LBL, and thus, the voltage level of the local bit line LBL may transition from "0" to "1".

Afterwards, at t4 at which the signal eLOP is activated, when the charge sharing occurs between the local computing line LCL and the local bit line LBL, the voltage values of the local computing line LCL and the local bit line LBL may maintain "1".

Referring to FIG. 8B, even though the voltage value of the local computing line LCL is maintained at "1" during a time period from t1 to t4, at t3, the voltage value of the local computing line LCL transitions from "1" to "0" due to "1" being the complementary weight W_b stored on the node N3 and the activation of the signal CSSE. During a time period from t3 to t4, since the LSB (i.e., [X0]) of the input data is input to the word line $WL_W$, "0" being the weight "W" stored on the node N3 is output to the local bit line LBL. Accordingly, the voltage value of the local bit line LBL may maintain "0". Afterwards, at t4 at which the signal eLOP is activated, when the charge sharing occurs between the local computing line LCL and the local bit line LBL, the voltage values of the local computing line LCL and the local bit line LBL may maintain "0".

Figure 9:
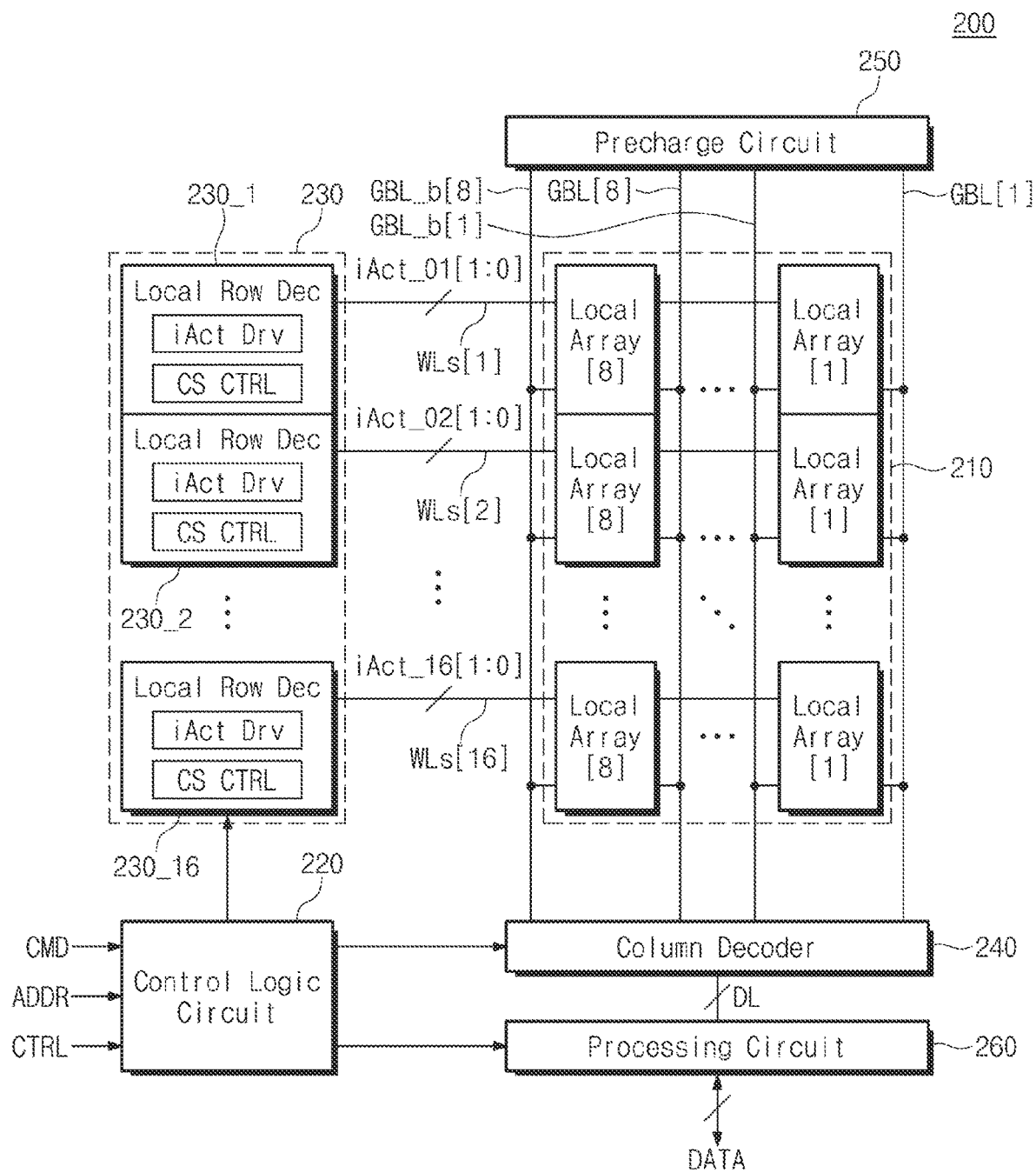
FIG. 9 illustrates a configuration of a memory device according to an embodiment of the present disclosure.
Figure 10:
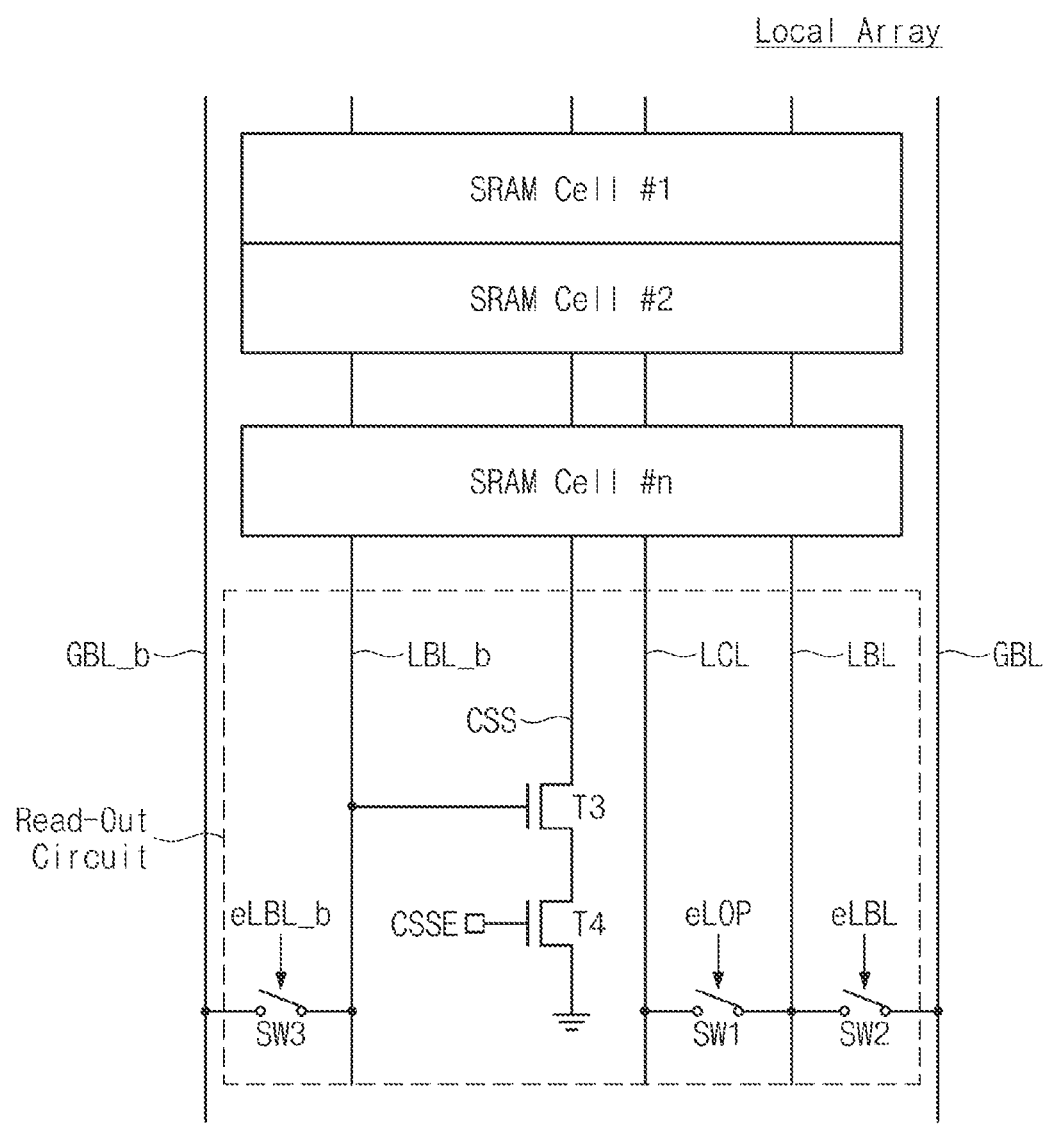
FIG. 10 is a diagram illustrating a configuration of a local array of FIG. 9.

FIG. 9 is a diagram illustrating a configuration of a memory device 200 according to an embodiment of the present disclosure. FIG. 10 is a diagram illustrating a configuration of a local array of FIG. 9.

Referring to FIGS. 9 and 10, the memory device 200 may include a memory cell array 210, a control logic circuit 220, a row decoder 230, a column decoder 240, a precharge circuit 250, and a processing circuit 260. The memory device 200 of FIG. 9 is mostly similar to the memory device 100 of FIG. 1, and thus, additional description will be omitted to avoid redundancy.

The memory cell array 210 may include a plurality of local arrays. In an embodiment, the local arrays are arranged in the shape of a matrix (e.g., of dimension 16×8). Each local array may include a plurality of SRAM cells and a read-out circuit. Each SRAM cell illustrated in FIG. 10 may be identical to the SRAM cell described with reference to FIG. 2, and the read-out circuit may be identical to the read-out circuit of FIG. 4. In an embodiment, the local array may include 16 SRAM cells, and SRAM cells included in one local array may share the local bit line LBL, the local computing line LCL, the complementary local bit line LBL_b, the global bit line GBL, and the complementary global bit line GBL_b. However, the SRAM cells included in one local array need not share word lines. That is, the word lines $WL_C$, $WL_{Wb}$, and WBw may be connected with each of the SRAM cells included in one local array.

The row decoder 230 may include a plurality of local row decoders. In an embodiment, 16 local row decoders 230_1 to 230_16 are present as illustrated in FIG. 9. Each local row decoder may select and drive the SRAM cells of the local arrays disposed for each row. For example, the first local row decoder 230_1 may select and drive the SRAM cells connected with first word lines WLs[1]. The first word lines WLs[1] may include the word lines $WL_C$, $WL_{Wb}$, and WBw as illustrated in FIG. 2. The first local row decoder 230_1 may provide the local array with 2-bit input data iAct_01[1:0] through the word lines WLc and WBw.

The column decoder 240 may select the global bit line pair GBL and GBL_b of the local array including the selected SRAM cell. The SRAM cells included in the local array may share the global bit line pair GBL and GBL_b.

Figure 11:
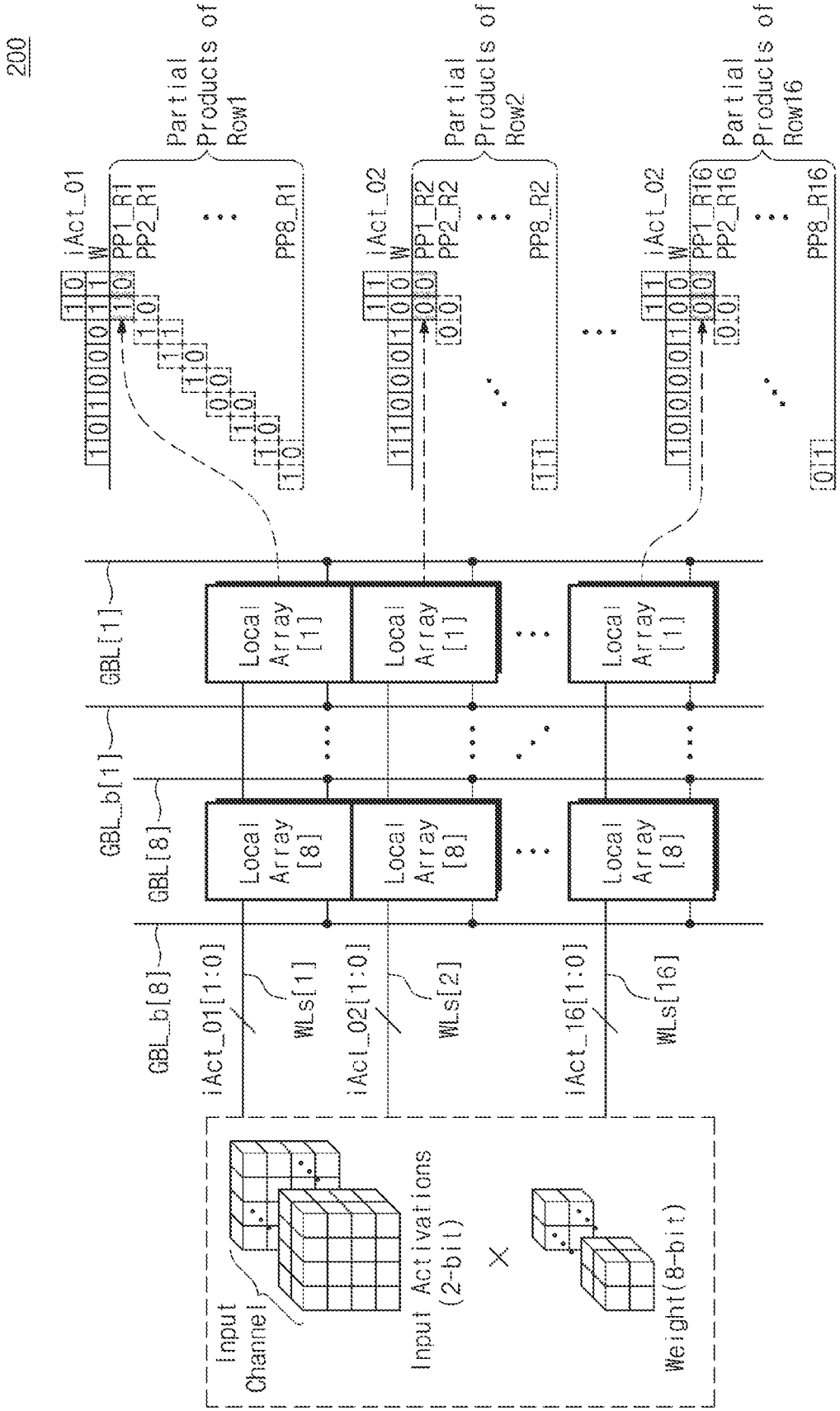
FIG. 11 is a diagram illustrating how to perform a MAC operation using a memory device of FIG. 9.

FIG. 11 is a diagram illustrating how to perform a MAC operation using a memory device of FIG. 9. For brevity of drawing, only local arrays constituting the memory cell array 210 are illustrated, and the description will be given with reference to FIGS. 9 to 11.

The memory device 200 may operate as an artificial neural network that performs the multiplication operation on input data and a weight. For example, the weight could be associated with a node of the artificial neural network, and the multiplication operation could be an operation of the node. Before the MAC operation is performed, the program operation for storing the weights in the SRAM cells may be performed. For example, an SRAM cell, which performs the MAC operation, from among the SRAM cells of local array [1] may store the weight of "1"; an SRAM cell, which performs the MAC operation, from among the SRAM cells of local array [2] may store the weight of "1"; and an SRAM cell, which performs the MAC operation, from among the SRAM cells of local array [3] may store the weight of "0". As in the above description, an SRAM cell, which performs the MAC operation, from among the SRAM cells of local array [8] may store the weight of "1". Below, for convenience of description, it is assumed that weights are stored in SRAM cells connected in common with the word lines $WL_C$, $WL_{Wb}$, and WLw described with reference to FIG. 4.

The row decoder 230 may provide the input data to the memory cell array 210. For example, the first local row decoder 230_1 may provide local array [1] to local array [8] with the 2-bit input data iAct_01[1:0] through the first word lines WLs[1]. In detail, the first local row decoder 230_1 may provide the first SRAM cell of local array [1] with the input data of "10". The input data of "10" may be marked by gray shading. The first local row decoder 230_1 may provide the input data of "10" to the first SRAM cell of local array [2] and may provide the input data of "11" to the first SRAM cell of local array [3]. As in the above description, the first local row decoder 230_1 may provide the input data of "10" to the first SRAM cell of local array [8].

When the input data iAct_01[1:0] (i.e., "10") is transferred through the first word lines WLs[1], the partial product may be performed on the input data iAct_01[1:0] and the weight stored in each SRAM cell. For example, the first SRAM cell of local array [1] may perform the multiplication operation on the input data of "10" (in detail, "00" where the MSB of the input data of "10" is inverted) and the weight of "1" as a first partial product PP1_R1; the first SRAM cell of local array [2] may perform the multiplication operation on the input data of "10" and the weight of "1" as a second partial product PP2_R1; the first SRAM cell of local array [3] may perform the multiplication operation on the input data of "10" and the weight of "0" as a third partial product PP3_R1. As in the above description, the first SRAM cell of local array [8] may perform the multiplication operation on the input data of "10" and the weight of "1" as an eighth first partial product PP81_R1. According to the above partial products, the SRAM cells of local array [1] to local array [8] may output "10", "10", "11", "10", "10", "00", "10", "10", and "10" being partial product results through the global bit lines GBL[1] to GBL[8].

Meanwhile, the MAC operations that are performed in the local arrays connected with one local row decoder may be performed in the same manner in local arrays connected with another local row decoder. For example, local array [1] to local array [8] connected with the second local row decoder 230_2 may respectively output "00", "00", . . . , "11" being partial product results through the global bit lines GBL[1] to GBL[8]. Also, local array [1] to local array [8] connected with the sixteenth local row decoder 230_16 may respectively output "00", "00", . . . , "01" being partial product results through the global bit lines GBL[1] to GBL[8].

Figure 12:
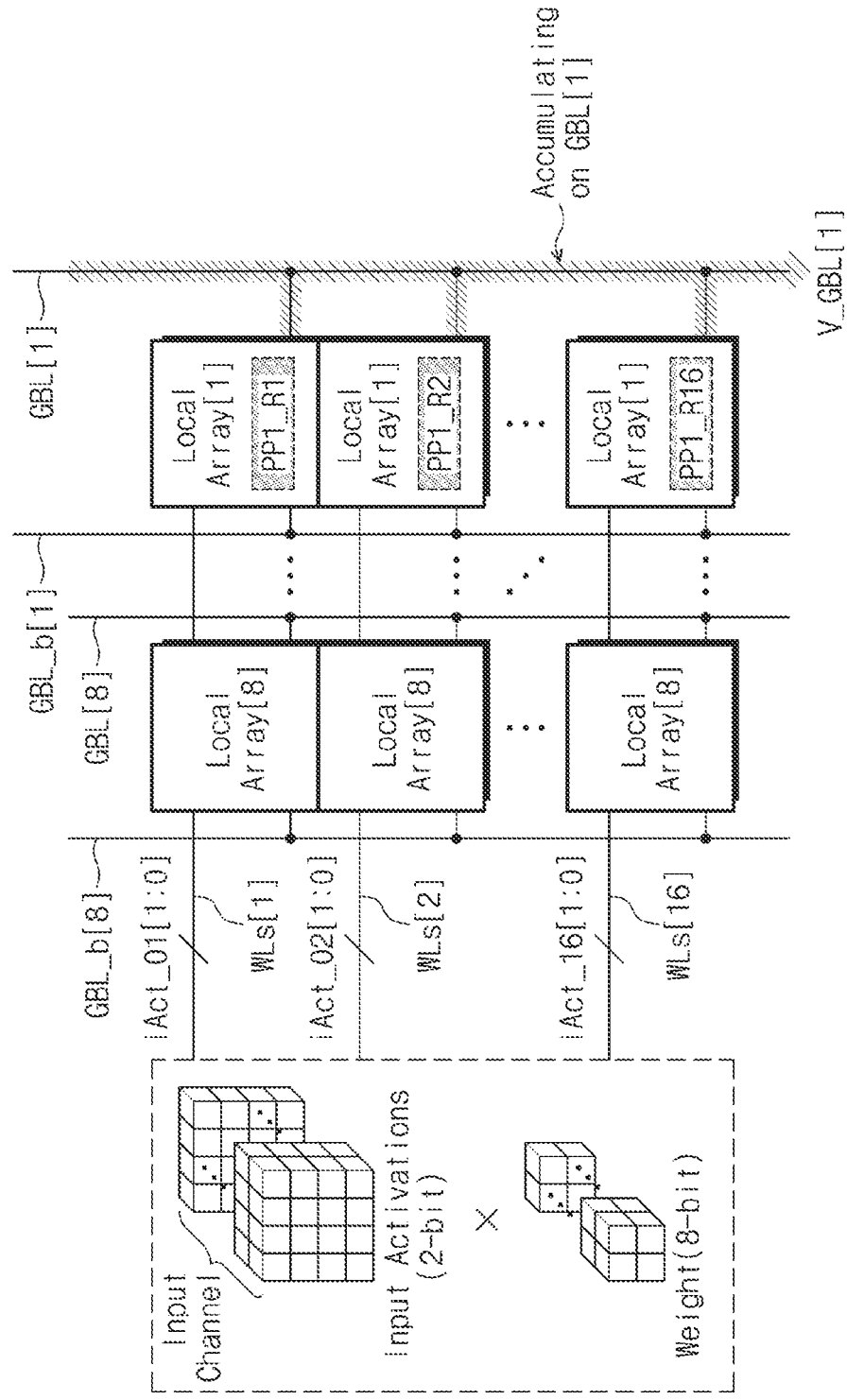
FIG. 12 is a diagram illustrating how to accumulate results of performing MAC operations by using a memory device of FIG. 11.

FIG. 12 is a diagram illustrating how to accumulate results of performing MAC operations by using a memory device of FIG. 11.

In an embodiment, partial product results may be output from each row at the same timing. For example, when there is a need to add the partial product results, the MAC operations may be simultaneously performed in the local arrays connected with the local row decoders 230_1 to 230_16. Results of the MAC operations performed in the local arrays connected with one global bit line may be simultaneously output to the global bit line. For example, the partial product results PP1_R1, PP1_R2, . . . , PP1_R16 may be output from the local arrays connected with the first global bit line GBL[1], and charges corresponding to each of the partial product results PP1_R1, PP1_R2, . . . , PP1_R16 may be accumulated on the first global bit line GBL[1]. As in the above description, results of the partial products performed in the remaining local arrays may be output to the global bit lines GBL[2] to GBL[16].

In an embodiment, partial product results may be output at different times in each row. For example, when there is no need to add the partial product results, it is not necessary to output the partial product results at the same timing. For example, after the MAC operations are performed in the local arrays connected with the first local row decoder 230_1, the MAC operations may be performed in the local arrays connected with the second local row decoder 230_2.

Figure 13:
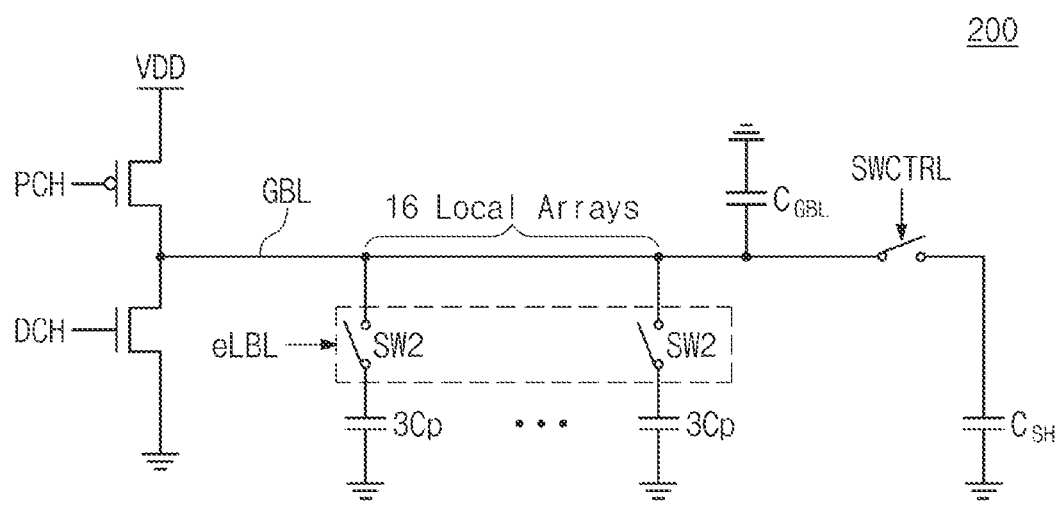
FIG. 13 is a circuit diagram associated with local arrays and a precharge circuit connected with one global bit line of a memory device.

FIG. 13 is a circuit diagram associated with local arrays and a precharge circuit connected with one global bit line of the memory device 200.

Referring to FIGS. 4, 9, and 13, prior to the calculation of the voltage of the global bit line GBL, components connected with one global bit line GBL may be modeled as illustrated in FIG. 13. For example, one local array may be expressed by "3Cp". In FIG. 13, Cp may represent the junction capacitance by the junction of the local bit line LBL and the first pass gate transistor PG1, and 2Cp may represent the junction capacitance by the junction of the local computing line LCL and the transistors T1 and T2. In FIG. 13, CG BL may represent the capacitance of the global bit line GBL, and $C_{SH}$ may represent any other capacitance component of an output terminal of the column decoder 240 that outputs a switch control signal SWCTRL.

According to the formula for the relationship between the amount of charges and the capacitance, the voltage of the global bit line GBL may be expressed by Equation 2 below. In Equation 2 below, ΔV represents the variations in voltage for each local array.

$$V_{GBL} = \frac{\sum 3Cp \times \Delta V}{16 \times 3Cp + C_{GBL} + C_{SH}} \quad \text{[Equation 2]}$$

According to Equation 2 above, because a sum of capacitances of the local arrays is greater than the remaining capacitances $C_{GBL}$ and $C_{SH}$, the linearity of the voltage $V_{GBL}$ of the global bit line GBL according to a value of a MAC operation result may be regarded as being maintained. The memory device according to the present disclosure may perform the MAC operation by using the charge sharing between the local computing line LCL and the local bit line LBL, and thus, an analog MAC voltage whose linearity is similar to an actual ideal value may be obtained. The memory device 200 may include a first transistor having a gate receiving a signal PCH and a second transistor having a gate receiving a signal DCH.

Figure 14:
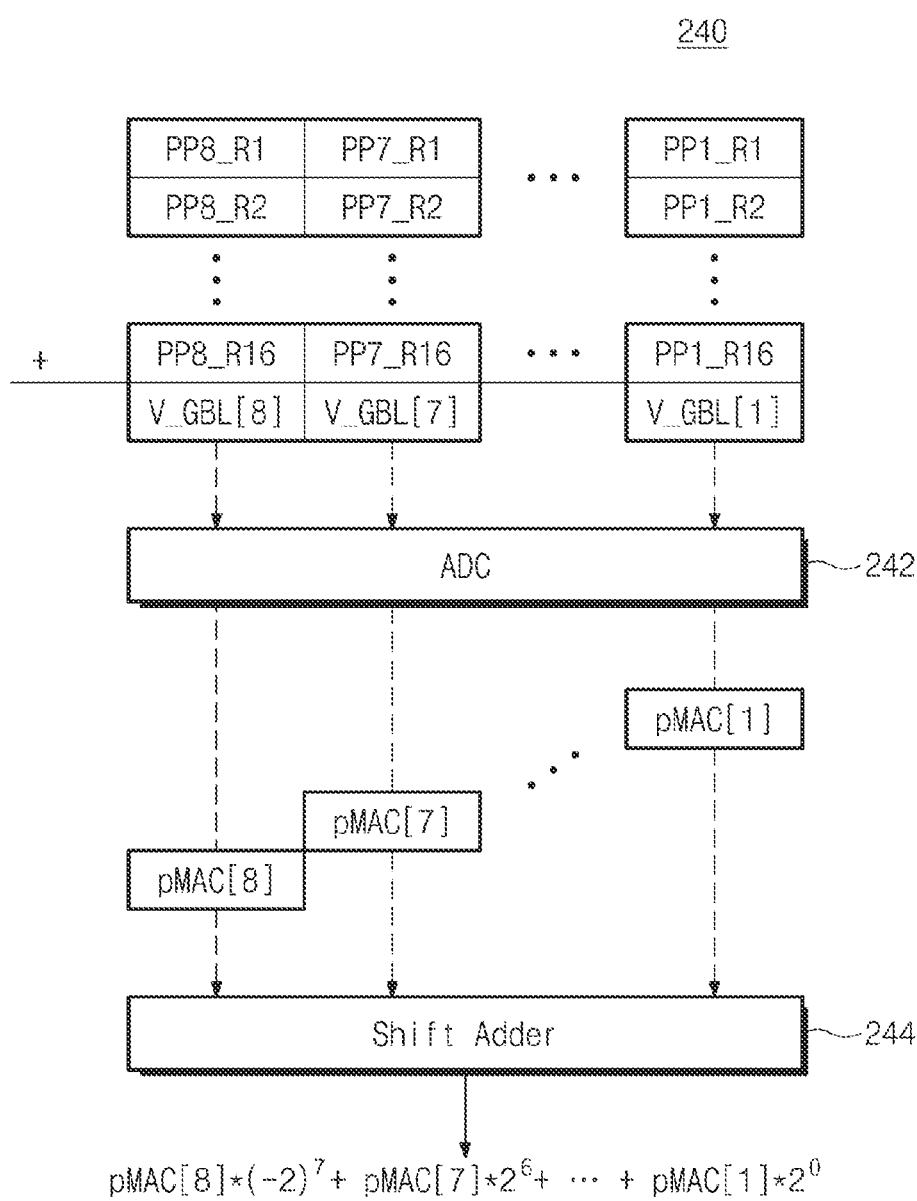
FIG. 14 is a diagram illustrating how to process a result of a MAC operation accumulated on a global bit line.

FIG. 14 is a diagram illustrating how to process a result of a MAC operation accumulated on a global bit line.

Referring to FIGS. 9, 11, and 14, the processing circuit 160 may include an analog-to-digital converter 242 and a shift adder 244.

The results PR1_R1, PR1_R2, and PR1_R16 of the MAC operations performed in the local arrays connected with the first global bit line GBL[1] may be accumulated on the first global bit line GBL[1] to generate an accumulation result, and the accumulation result may be input to the ADC 242. The ADC 242 may output a first partial MAC value pMAC [1] based on the accumulation result. As in the above description, the ADC 242 may output a seventh partial MAC value pMAC[7] and an eighth partial MAC value pMAC[8].

The shift adder 244 may receive the first partial MAC value pMAC[1] to the eighth partial MAC value pMAC[8]. The shift adder 244 may output the MAC operation result of a complete form based on the first partial MAC value pMAC[1] to the eighth partial MAC value pMAC[8]. For example, the shift adder 244 may multiply $2^0$ and the first partial MAC value pMAC[1] together, may multiply $2^6$ and the seventh partial MAC value pMAC[7] together, may multiply $(-2)^7$ and the eighth partial MAC value pMAC[8] together, and sum the results of the multiplies. Herein, $(-2)^7$ may be multiplied by a partial MAC value to express a negative MAC operation result.

Figure 15:
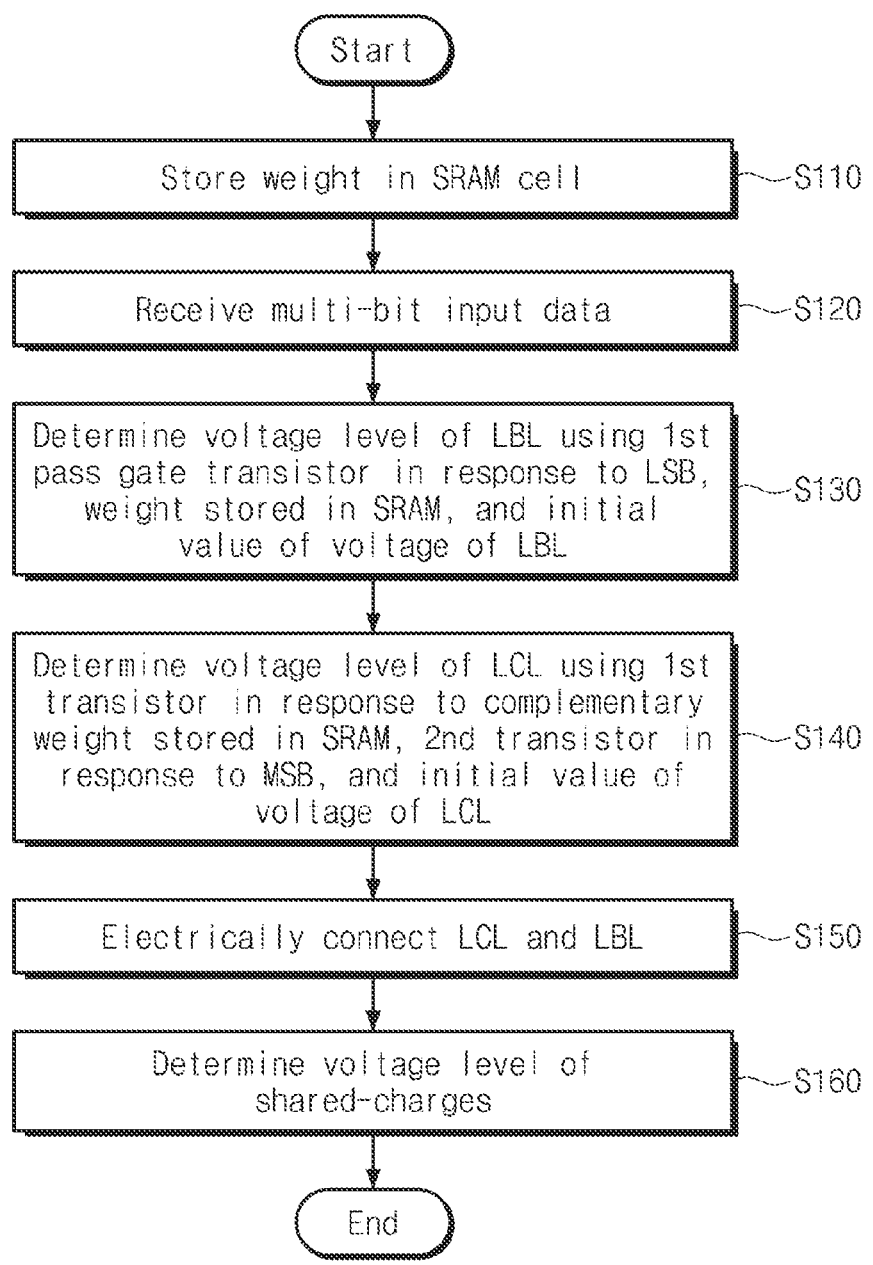
FIG. 15 is a flowchart illustrating a method of performing a MAC operation, according to an embodiment of the present disclosure.

FIG. 15 is a flowchart illustrating a method of performing a MAC operation, according to an embodiment of the present disclosure.

Referring to FIGS. 1, 4, and 15, in operation S110, the program operation is performed on the SRAM cell. For example, the program operation may store a weight in an SRAM cell. The weight "W" may be input to the SRAM cell through the word lines $WL_{Wb}$ and $WL_W$, and the weight "W"

and the complementary weight W_b may be respectively stored on the node N2 and the node N3.

In operation S120, the SRAM cell receives multi-bit input data.

In operation S130, the SRAM cell determines a voltage level of the local bit line LBL by using the first pass gate transistor PG1, which operates in response to the LSB of the input data input through the word line $WL_W$, the weight "W" stored on the node N2, and an initial value of the voltage of the local bit line LBL.

In operation S140, the SRAM cell determines a voltage level of the local computing line LCL by using the first transistor T1, which operates in response to the complementary weight W_b stored in the SRAM cell, the second transistor T2 that operates in response to an inverted value of the MSB of the input data input through the word line $WL_C$, and an initial value of the voltage of the local computing line LCL. In an embodiment, the determining of the voltage level of the local computing line LCL and the determining of the voltage level of the local bit line LBL may be performed at the same time or at different times.

In an embodiment, before the MAC operation is performed in the SRAM cell, the precharge circuit 150 may precharge the local computing line LCL and may discharge the local bit line LBL.

In operation S150, the local computing line LCL and the local bit line LBL are electrically connected such that the charges of the local computing line LCL and the local bit line LBL are shared. Afterwards, the local computing line LCL and the local bit line LBL may be electrically connected with the global bit line GBL, and thus, the shared charges may be output through the global bit line GBL.

In operation S160, a voltage level corresponding to the shared charges is determined. For example, the analog-to-digital converter of the processing circuit 160 may detect the voltage level of the global bit line GBL and may output a MAC value corresponding to the voltage level thus detected.

Figure 16:
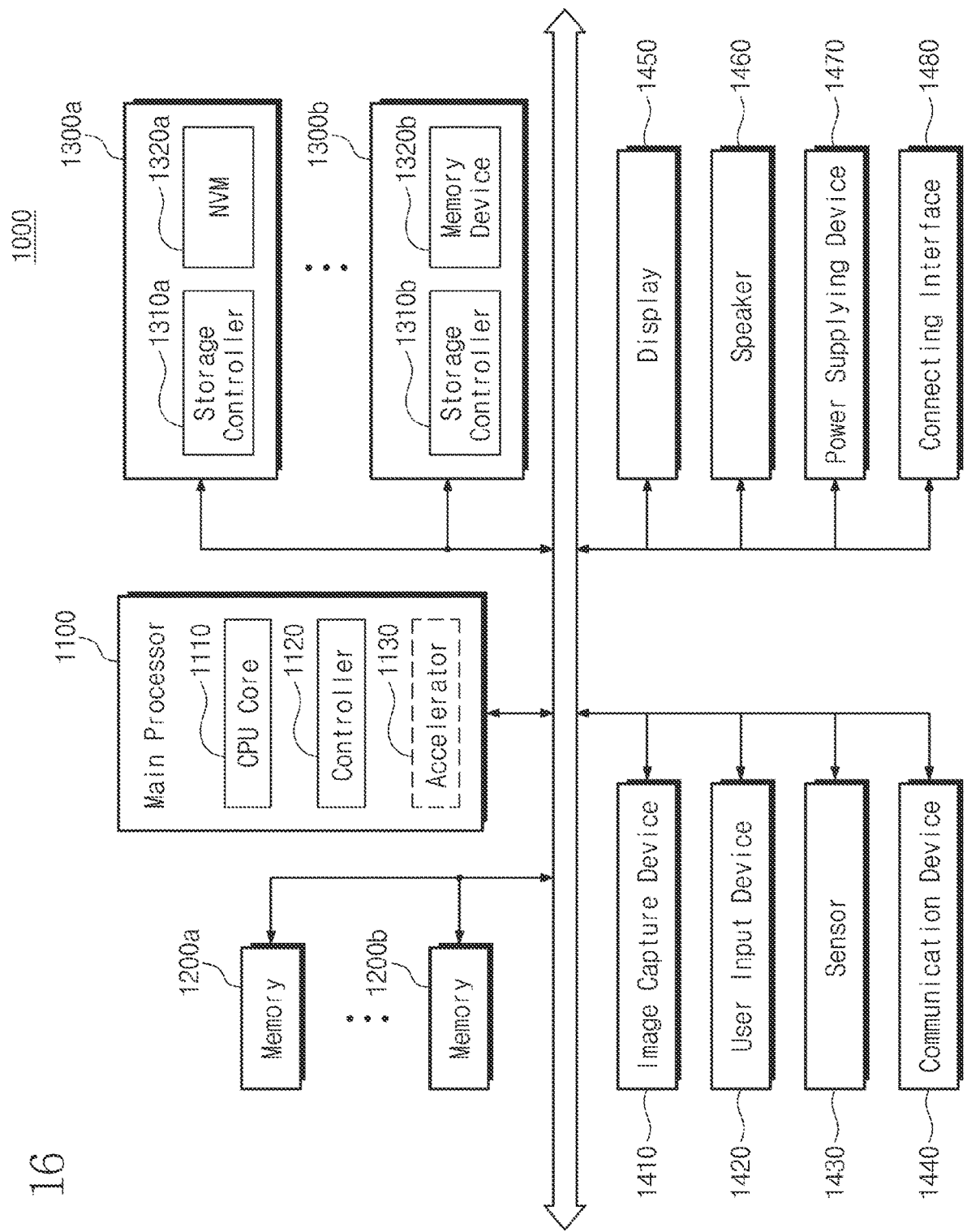
FIG. 16 is a diagram illustrating a system to which a memory device including an SRAM cell according to an embodiment of the present disclosure is applied.

FIG. 16 is a diagram of a system 1000 to which a storage device including an SRAM is applied, according to an embodiment. The system 1000 of FIG. 16 may be a mobile system, such as a portable communication terminal (e.g., a mobile phone), a smartphone, a tablet personal computer (PC), a wearable device, a healthcare device, or an Internet of things (IOT) device. However, the system 1000 of FIG. 16 is not necessarily limited to the mobile system and may be a PC, a laptop computer, a server, a media player, or an automotive device (e.g., a navigation device).

Referring to FIG. 16, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

In an embodiment, at least one of the memories 1200a and 1200b may include the SRAM cell described with reference to FIGS. 1 to 15. At least one of the memories 1200a and 1200b may operate as an artificial neural network performing the MAC operation on multi-bit input data and a weight. If a data transfer between the main processor 1100 and the memory device is performed for the MAC operation, such would cause an increase in power consumption and a decrease in efficiency of calculation. However, according to an embodiment of the present disclosure, the MAC operation is performed entirely by at least one of the memories 1200a and 1200b. As a result, the power consumption according to the data transfer may be prevented, and the efficiency of calculation may be improved.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVM (Non-Volatile Memory)s 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

According to the present disclosure, there may be provided an SRAM cell configured to perform a MAC operation on multi-bit data based on charge sharing.

According to the present disclosure, there may be provided an SRAM cell configured to perform a MAC operation without using a separate storage element such as a capacitor.

According to the present disclosure, since the MAC operation is performed on the multi-bit data based on the charge sharing, a good linearity may be obtained.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A static random access memory (SRAM) cell comprising:
a first pass gate transistor including a gate electrode connected with a first word line, a first end connected with a local bit line, and a second end;
a first inverter including an output terminal connected with the second end of the first pass gate transistor and an input terminal;
a second inverter including an input terminal connected with the second end of the first pass gate transistor and an output terminal;
a second pass gate transistor including a gate electrode connected with a second word line, a first end connected with the input terminal of the first inverter and the output terminal of the second inverter, and a second end connected with a complementary local bit line;
a first transistor including a gate electrode connected with the first end of the second pass gate transistor, a first end connected with a local computing line, and a second end;
a second transistor including a gate electrode connected with a third word line, a first end connected with the local computing line, and a second end connected with the ground electrode; and
a first switch configured to selectively connect the local computing line and the local bit line in response to a control signal.

2. The SRAM cell of claim 1, wherein a junction capacitance by a junction of the local computing line, the first transistor, and the second transistor is two times a junction capacitance by a junction of the local bit line and the first pass gate transistor.

3. The SRAM cell of claim 1, wherein the output terminal of the first inverter and the input terminal of the second inverter store a weight based on a first signal input to the first word line and a second signal input to the second word line, and wherein the input terminal of the first inverter and the output terminal of the second inverter store a complementary weight based on the first signal input to the first word line and the second signal input to the second word line.

4. The SRAM cell of claim 3, wherein a least significant bit (LSB) of input data is input to the first word line, and an inverted value of a most significant bit (MSB) of the input data is input to the third word line.

5. The SRAM cell of claim 4, wherein, in response to the LSB input to the first word line, the first pass gate transistor transfers the weight to the local bit line or allows an initial value of the local bit line to be maintained.

6. The SRAM cell of claim 4, wherein, in response to the complementary weight, the first transistor connects the local computing line with the ground electrode or allows an initial value of the local computing line to be maintained, and wherein, in response to the inverted value of the MSB input to the third word line, the second transistor connects the local computing line with the ground electrode or allows the initial value of the local computing line to be maintained.

7. The SRAM cell of claim 6, further comprising:
a first switch configured to electrically connect the local computing line and the local bit line; and
a second switch configured to electrically connect the local computing line and the local bit line, which are electrically connected, with a global bit line.

8. A memory device comprising:
cross-coupled inverters;
a first pass gate transistor configured to transfer a weight stored on a first node of the cross-coupled inverters to a local bit line in response to a least significant bit (LSB) of input data;
a second pass gate transistor configured to transfer a complementary weight stored on a second node of the cross-coupled inverters to a complementary local bit line; a first transistor configured to output charges stored on a local computing line to a ground computing line in response to the complementary weight;
a second transistor configured to discharge the charges stored on the local computing line in response to an inverted value of a most significant bit (MSB) of the input data; and
a read-out circuit, wherein, in response to a voltage of the complementary local bit line, the read-out circuit discharges the charges output to the ground computing line and electrically connects the local computing line to the local bit line.

9. The memory device of claim 8, wherein the read-out circuit comprises:
a third transistor configured to transfer the charges output to the ground computing line in response to the voltage of the complementary local bit line;
a fourth transistor configured to output the charges transferred by the third transistor to a ground electrode;
a first switch configured to electrically connect the local computing line to the local bit line; and
a second switch configured to electrically connect the local computing line and the local bit line, which are electrically connected, with a global bit line.

10. The memory device of claim 8, further comprising:
a precharge circuit configured to precharge or discharge the local computing line and the local bit line.

11. The memory device of claim 8, further comprising:
a row decoder configured to select and drive word lines through which the LSB of the input data and the inverted value of the MSB of the input data are transferred; and
a column decoder configured to select a global bit line electrically connected with the local computing line and the local bit line, which are electrically connected.

12. The memory device of claim 11, further comprising:
an analog-to-digital converter configured to detect a voltage level of the global bit line to which charges shared through the electrical connection of the local computing line and the local bit line are output and to output a value corresponding to the voltage level; and
a shift adder configured to perform shift adding on the value output from the analog-to-digital converter.

13. The memory device of claim 11, further comprising:
a control logic circuit configured to receive a command and an address from outside and to generate a row address for selecting the word lines and a column address for selecting the global bit line based on the command and the address.

14. The memory device of claim 8, wherein a junction capacitance by a junction of the local computing line, the first transistor, and the second transistor is two times a junction capacitance by a junction of the local bit line and the first pass gate transistor.

15. A memory device comprising:
a first static random access memory (SRAM) cell configured to store a first weight on a first node and a first complementary weight on a second node, wherein the first SRAM cell comprises:
a first pass gate transistor configured to output the first weight to a first local bit line in response to a least significant bit (LSB) of first input data;
a first transistor configured to connect a first local computing line with a ground electrode in response to the first complementary weight; and
a second transistor configured to connect the first local computing line with the ground electrode in response to an inverted value of a most significant bit (MSB) of the first input data;
a first read-out circuit configured to electrically connect the first local computing line and the first local bit line with a global bit line;
a second SRAM cell configured to store a second weight on a third node and a second complementary weight on a fourth node, wherein the second SRAM cell comprises:
a third pass gate transistor configured to output the second weight to a second local bit line in response to an LSB of second input data;
a third transistor configured to connect a second local computing line with the ground electrode in response to the second complementary weight; and
a fourth transistor configured to connect the second local computing line with the ground electrode in response to an inverted value of an MSB of the second input data; and
a second read-out circuit configured to electrically connect the second local computing line and the second local bit line with the global bit line.

16. The memory device of claim 15, further comprising:
a precharge circuit configured to precharge or discharge the first and second local computing lines and the first and second local bit lines.

17. The memory device of claim 15, further comprising:
a first local row decoder configured to select and drive first word lines through which the LSB of the first input data and the inverted value of the MSB of the first input data are transferred;
a second local row decoder configured to select and drive second word lines through which the LSB of the second input data and the inverted value of the MSB of the second input data are transferred; and
a column decoder configured to select the global bit line.

18. The memory device of claim 15, further comprising:
an analog-to-digital converter configured to detect a voltage level of the global bit line and to output a value corresponding to the voltage level of the global bit line; and
a shift adder configured to perform shift adding on the value output from the analog-to-digital converter.

19. The memory device of claim 15, further comprising:
a control logic circuit configured to receive a command and an address from outside and to generate row addresses for selecting the first word lines and the second word lines and a column address for selecting the global bit line based on the command and the address.

20. The memory device of claim 15, wherein a junction capacitance by a junction of the first local computing line, the first transistor, and the second transistor is two times a junction capacitance by a junction of the first local bit line and the first pass gate transistor, and wherein a junction capacitance by a junction of the second local computing line, the third transistor, and the fourth transistor is two times a junction capacitance by a junction of the second local bit line and the third pass gate transistor.

* * * * *